United States Patent [19]
Lien

[11] Patent Number: 5,644,155
[45] Date of Patent: Jul. 1, 1997

[54] STRUCTURE AND FABRICATION OF HIGH CAPACITANCE INSULATED-GATE FIELD EFFECT TRANSISTOR

[75] Inventor: Chuen-Der Lien, Mountain View, Calif.

[73] Assignee: Integrated Device Technology, Inc., Santa Clara, Calif.

[21] Appl. No.: 301,365

[22] Filed: Sep. 6, 1994

[51] Int. Cl.$^6$ .................................................. H01L 29/76
[52] U.S. Cl. ................................................ 257/401; 257/903
[58] Field of Search ........................... 257/401, 903, 257/344, 409, 400

[56] References Cited

U.S. PATENT DOCUMENTS

| | | | |
|---|---|---|---|
| 3,289,093 | 11/1966 | Wanlass | 330/35 |
| 3,356,858 | 12/1967 | Wanlass | 307/38.5 |
| 3,513,364 | 5/1970 | Heiman | 317/235 |
| 3,892,033 | 7/1975 | Kooi | 29/576 |
| 3,938,174 | 2/1976 | Sano | 257/400 |
| 5,200,637 | 4/1993 | Matsuo et al. | 257/409 |
| 5,217,915 | 6/1993 | Hashimoto et al. | 437/48 |
| 5,483,083 | 1/1996 | Meguro et al. | 257/903 |

OTHER PUBLICATIONS

Lin et al., "Complementary MOS-Bipolar Transistor Structure", IEEE Trans. on Electron Devices, vol. ED-16, No. 11, Nov. 1969, pp. 945–951.

Wolf, Stanley, "A Review of IC Isolation Technologies–Part 2", Solid State Technology, May, 1992, p. 103.

Ochoa, Jr., et al., "A Proposed New Structure for SEU Immunity in SRAM Employing Drain Resistance", IEEE Log No. 8717686, 1987, pp. 537–539.

Kerns, Sherra and B.D. Shafer, "The Design of Radiation-Hardened ICs for Space: A Compendium of Approaches", Proc. of the IEEE, vol. 76, No. 11, Nov., 1988, pp. 1470–1509.

*Primary Examiner*—Mark V. Prenty
*Attorney, Agent, or Firm*—Skjerven, Morrill, MacPherson, Franklin & Friel

[57] ABSTRACT

A high capacitance field effect transistor for use in an integrated memory circuit is fabricated with an optimized gate electrode and active region overlap, increasing the gate electrode to substrate capacitance thereby minimizing the effect of alpha particle upset. The optimized overlap is accomplished by maximizing the opening in the field oxide layer which defines the active region. In some embodiments, the transistor is also optimized for overall cell layout area.

29 Claims, 26 Drawing Sheets

5,644,155

STRUCTURE AND FABRICATION OF HIGH CAPACITANCE INSULATED-GATE FIELD EFFECT TRANSISTOR

FIELD OF THE INVENTION

This invention relates to high capacitance semiconductor devices. More particularly, this invention relates to a high capacitance insulated-gate field effect transistor structure and to a method for making the same. The invention has broad applicability to both memory cells and logic circuits.

BACKGROUND OF THE INVENTION

Alpha particle upset of MOS transistors in static memory cells is a well-known problem. Alpha particles can cause the state of a static RAM cell to change in a random, normally undesirable manner. This alpha particle upset problem becomes increasingly serious as technology advances and transistor dimensions shrink. The sensitivity of an MOS static memory cell to alpha particles is directly related to the magnitude of the charge maintained by the cross-coupled cell storage transistors at the cell storage nodes. The magnitude of the stored charge, in turn, depends directly on certain parasitic capacitances associated with the storage transistors. Higher cell capacitance provides greater resistance to alpha particle upset and therefore better radiation hardening.

Although the capacitance of an MOS memory cell can be increased by adding capacitors and resistors, these approaches normally increase the cell layout area and/or complexity of the cell fabrication process.

FIG. 1 is a top view of a conventional enhancement-mode n-channel field effect transistor 100. FIGS. 2A–2D are cross-sectional views of transistor 100 through planes 2A—2A, 2B—2B, 2C—2C and 2D—2D, respectively, of FIG. 1.

In fabricating transistor 100 in accordance with conventional technology, a pad oxide layer and an oxygen impervious silicon nitride layer (not shown) are formed over the upper surface of a monocrystalline silicon 114. An active region photoresist mask (not shown) is created over the areas on the surface of substrate 114 where the laterally separated active silicon regions will be located. The portions of the oxygen-impervious layer not covered by the active region mask are removed, thereby creating an oxygen-impervious nitride mask. A field oxide layer 130 is then grown along the upper surface of silicon substrate 114 where there is no oxygen-impervious material, thereby defining active region silicon 120. Active region 120 is defined by boundary 121 of field oxide layer 130. Boundary 121 has sides 121a and 121b, which each have a width of $W_{SD}$, and sides 121c and 121d, which each have a length $L_{SD}$.

The oxygen-impervious mask is then removed along with any silicon oxide present on the upper surfaces of the active regions. A gate dielectric layer 135 consisting of silicon oxide is thermally grown along the upper surface of active region 120. A gate electrode 110 is formed by depositing a gate electrode layer over field oxide layer 130 and gate dielectric layer 135 and then using a gate electrode mask to pattern the gate electrode layer. Gate electrode 110 has a width $W_G$ along side 110a and a length $L_G$ along side 110b.

Using field oxide layer 130 and gate electrode 110 as a mask, an n-type impurity is ion implanted into the exposed substrate surface. A source/drain mask 190 (FIG. 1), which is a non-critical mask with respect to the creation of transistor 100, protects certain peripheral areas from receiving the n-type impurity. An anneal is performed to activate the implanted impurity and drive the implant further into the silicon substrate 114, thereby forming source region 140 and drain region 150. As a result, the edges of source region 140 and drain region 150 are self-aligned to gate electrode 110 and field oxide 130.

As illustrated in FIGS. 1, 2A and 2D, gate electrode 110 extends laterally beyond active region 120 and partly over field oxide 130. The capacitance of transistor 100 is largely defined and limited by the area of gate electrode 110 directly over thin oxide layer 135, i.e., the area of gate electrode 110 over active region 120. In transistor 100, this area is $L_G \times W_{SD}$. The cell layout area of transistor 100 is approximately $L_{SD} \times W_G$. Because the capacitance of transistor 100 is directly proportional to the area of gate electrode 110 which overlies the thin oxide layer 135, the capacitance per cell layout area of transistor 100 is proportional to $(L_G \times W_{SD})/(L_{SD} \times W_G)$ FIG. 3 is a cross sectional view of a conventional lightly doped drain (LDD) field effect transistor 105. LDD transistor 105 is a variation of transistor 100. Thus, substrate 114, field oxide layer 130, gate oxide layer 135 and gate electrode 110 of LDD transistor 105 are formed in the manner previously described in connection with transistor 100. Lightly doped source region 140b and lightly doped drain region 150b are defined in a self-aligned manner by implanting an n-type impurity into the source and drain regions at a low dosage using gate electrode 110 and field oxide 130 as a mask. Then, a blanket oxide layer is formed on top of the structure and an anisotropic etch is performed to create oxide spacers 171 and 172 along both sides of gate electrode 110. Using spacers 171–172 and field oxide 130 as a second mask, an n-type impurity is implanted at a high dosage to define source region 140a and drain region 150a. An annealing step is then performed to activate the dopant and thereby form n+ source region 140a, n− source region 140b, n+ drain region 150a and n− drain region 150b in substrate 114.

The overlap region between gate electrode 110 and active region 120 of conventional n-channel transistor 100 and the overlap region between gate electrode 110 and active region 120 of conventional n-channel transistor 105 are relatively small compared to the cell layout area. As such, the structures of transistors 100 and 105 have not been optimized to achieve a high capacitance per cell layout area. Accordingly, a need arises for an optimized high capacitance MOS transistor which has a high capacitance per cell layout area so that the transistor is less susceptible to alpha particle upset, and can be fabricated without substantially increasing process complexity.

SUMMARY OF THE INVENTION

In accordance with this invention, prior art difficulties arising from alpha particle upset of storage transistors of an MOS memory cell are typically alleviated by increasing the area of overlap between the gate electrodes and active regions of the storage transistors while maintaining substantially the same memory cell layout area and/or the same number of process steps. The increased overlap increases the cell capacitance, thereby providing greater resistance to alpha particle upset.

One embodiment of the present invention includes a field effect transistor having a field insulating layer formed along the upper surface of a substrate to define a boundary of an active region. A gate dielectric layer and a gate electrode are located over the active region, with the gate electrode laterally separated from the boundary of the active region.

The gate electrode is normally wider than source and drain regions situated in the active region adjacent to the dielectric layer. The width of a transistor is measured in the lateral direction, generally perpendicular to the direction of source-drain current flow. The gate dielectric material situated below the portions of the gate electrode extending laterally beyond the source and drain regions contributes to, and thus increases, the cell capacitance.

In an alternate embodiment, the gate electrode of a field effect transistor extends to at least one side of the boundary of the active region. Source and drain regions are situated in the active region, laterally separated from the above-mentioned side of the boundary of the active region.

In another embodiment, the gate dielectric layer and gate electrode are located over the active region, with the gate electrode overlapping the field insulating layer at at least one side of the active region. A source or drain region is situated in the active region laterally separated from the above-described side of the active region.

In a variation of the above described transistors, a lightly doped drain region is continuous with a more heavily doped drain region.

Fabrication of a high capacitance field effect transistor according to one embodiment of the invention entails forming a field insulating layer along an upper surface of a semiconductor substrate to define a boundary of an active region. A dielectric layer is formed along the active region. A gate electrode is formed over the dielectric layer, laterally separated from the boundary of the active region. Source and drain regions are defined within the active region using a source/drain mask. The source and drain regions are laterally separated from one another. In addition, the source and drain regions are formed such that portions of the source and drain regions are laterally separated from the boundary of the active region.

In an alternate embodiment,.the gate electrode extends to at least one side of the boundary of the active region. In this embodiment, the source and drain regions are formed such that portions of the source and drain regions are laterally separated from the above-mentioned side of the boundary of the active region.

In another fabrication embodiment, a high capacitance field effect transistor is created by forming a gate electrode over an active region of a semiconductor substrate such that the gate electrode slightly overlaps a field insulating layer at ends of the active region. Source and drain regions are defined within the active region using a source/drain mask such that the source and drain regions are laterally separated from the ends of the active region.

In a further embodiment, a high capacitance LDD field effect transistor is created by forming a gate electrode which is laterally separated from a boundary of an active region of a semiconductor substrate. An ion implant is performed through a first source/drain mask at a low dosage. Dielectric spacers are then formed adjacent to the gate electrode and a second source/drain mask is formed. An ion implant is then performed through the second source/drain mask at a higher dosage. In one embodiment, the first and second source/drain masks are substantially identical. In other embodiments, the first and second source/drain masks have openings of different sizes.

In yet another embodiment, a high capacitance LDD field effect transistor is created by forming a gate electrode over an active region such that a small portion of each end of the gate electrode overlaps field oxide that exists at the boundary of the active region. An ion implant is performed through a source/drain mask at a low dosage. Dielectric spacers are then formed adjacent to the gate electrode and an ion implant is performed at a high dosage, using the gate electrode, dielectric spacers and field oxide as a mask to define heavily doped source and drain regions. The portions of the heavily doped source and drain regions near the ends of the gate electrode prevent punch through.

The transistors that result from the previously described methods allow more of the gate electrode to overlie the gate dielectric, advantageously increasing the capacitance per cell layout area of the resulting transistor.

DETAILED DESCRIPTION OF THE INVENTION

Figure 4:
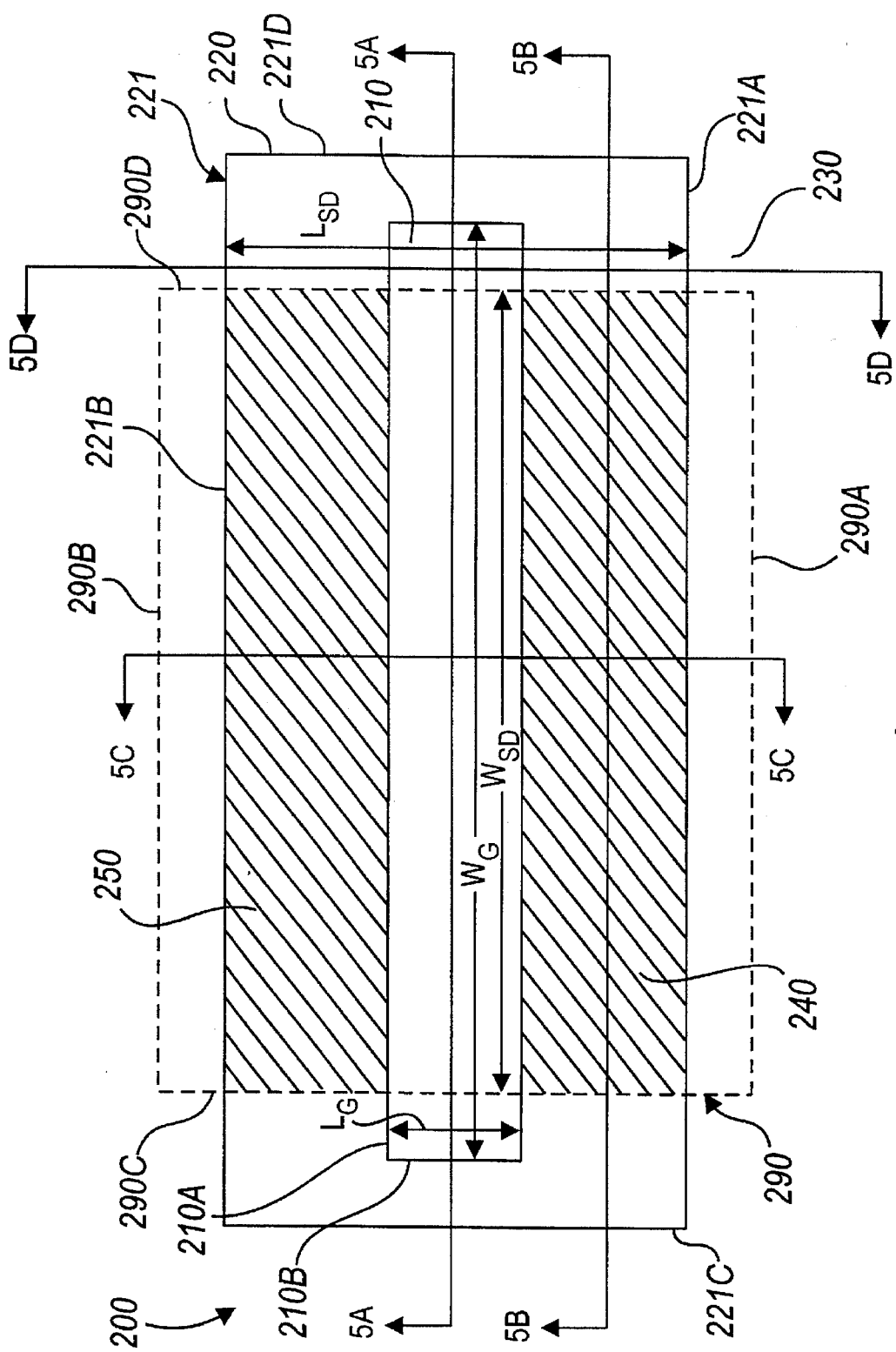
FIG. 4 is a top view of one embodiment of a high capacitance n-channel field effect transistor in accordance with the invention.
Figure 5A:
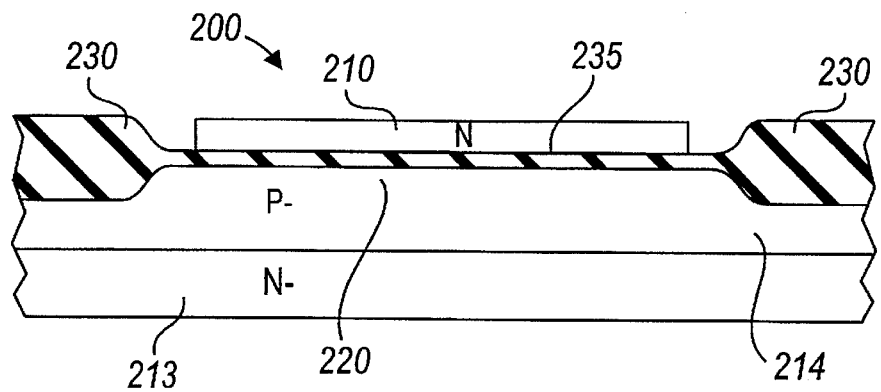
FIGS. 5A–5D are cross-sectional views of the transistor of FIG. 4 through planes 5A—5A, 5B—5B, 5C—5C, and 5D—5D, respectively, of FIG. 4.
Figure 5B:
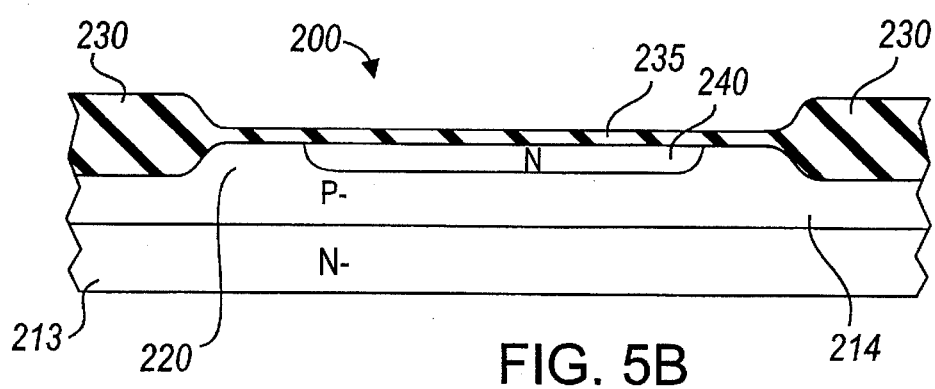
Figure 5C:
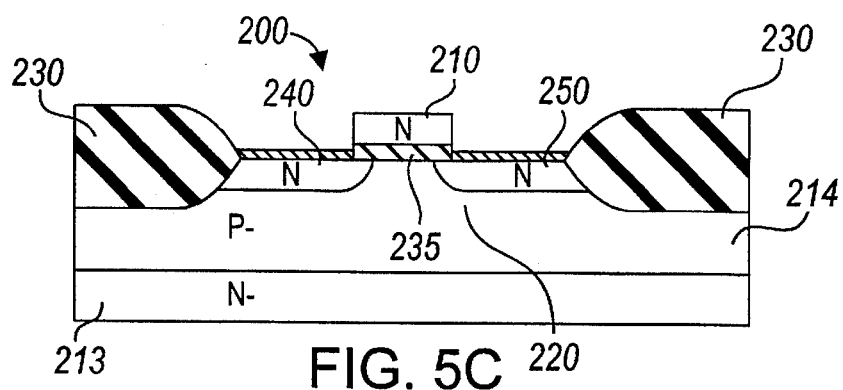
Figure 5D:
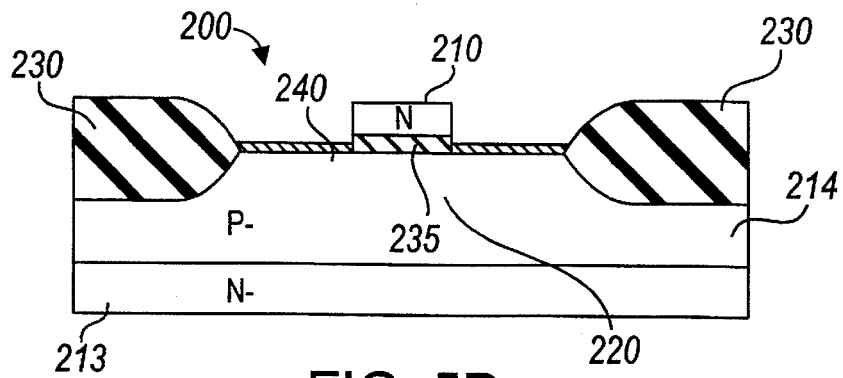

FIG. 4 is a top view of a high capacitance n-channel field effect transistor 200 in accordance with the invention. FIGS. 5A, 5B, 5C and 5D are cross-sectional views through transistor 200. In a first embodiment, transistor 200 is fabricated in active region 220 of a lightly doped p-type monocrystalline silicon semiconductor region 214. Region 214 is typically a P-well region formed in a lightly doped n-type monocrystalline silicon semiconductor substrate 213. Active region 220 is defined by boundary 221 of field oxide layer 230. Boundary 221 includes sides 221a–221d. Gate electrode 210 is formed entirely within active region 220, with the edges of gate electrode 210 laterally separated from field oxide layer 230 (FIGS. 4, 5A, 5C and 5D). Gate electrode 210 has a width along side 210a and a length along side 210b. Gate oxide 235 separates gate electrode 210 from P-well region 214 (FIGS. 5A, 5C and 5D). Source region 240 and drain region 250 (both shaded in FIG. 4, except where electrode 210 overlaps source and drain regions 240 and 250) are defined by a source/drain implant mask 290, gate electrode 210 and field oxide layer 230 (FIGS. 4 and 5C). The location of source/drain mask 290 is indicated by dashed lines in FIG. 4. Source/drain mask 290 has sides 290a–290d.

In one embodiment, gate electrode 210, source region 240 and drain region 250 of transistor 200 are the same size as gate electrode 110, source region 140 and drain region 150 of transistor 100. Table 1 sets forth a comparison between the transistors 100 and 200 in such an embodiment.

TABLE 1

Figure 1:
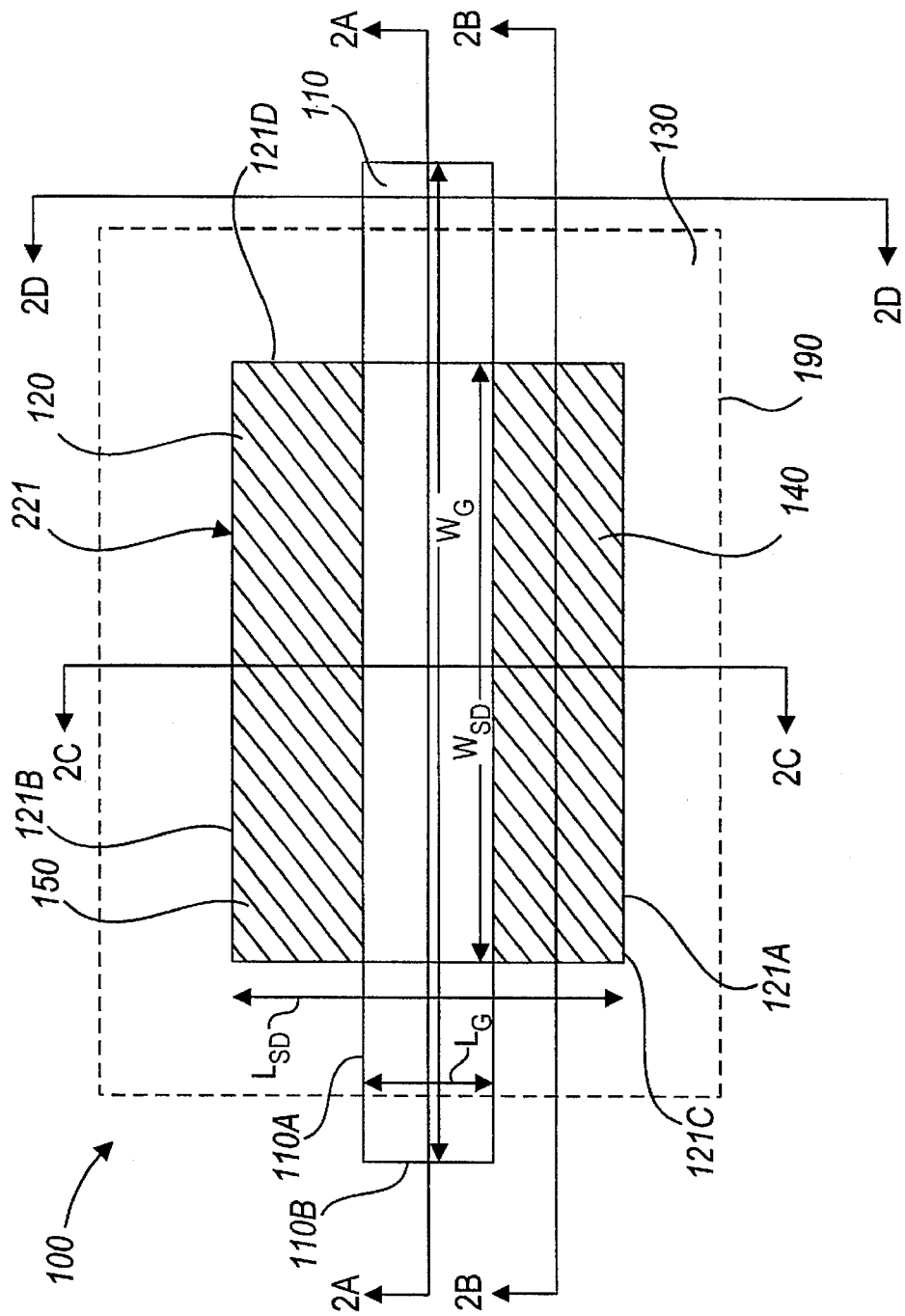
FIG. 1 is a top view of a conventional n-channel field effect transistor.
Figure 2A:
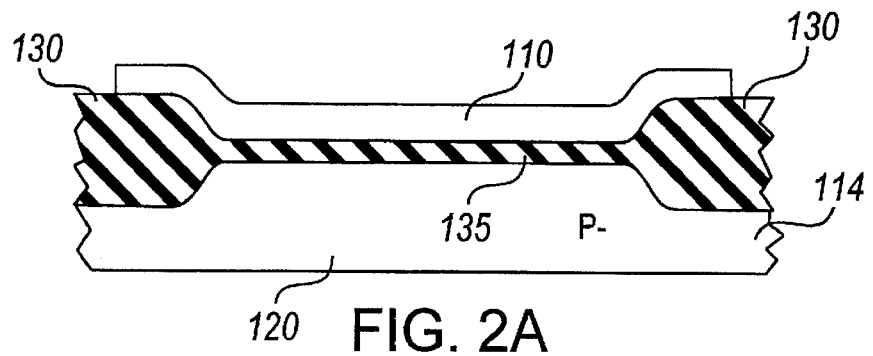
FIGS. 2A–2D are cross-sectional views of the transistor of FIG. 1 through planes 2A—2A, 2B—2B, 2C—2C and 2D—2D, respectively, of FIG. 1.
Figure 2B:
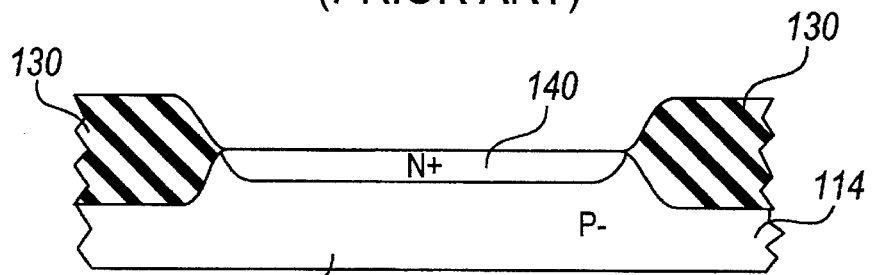
Figure 2C:
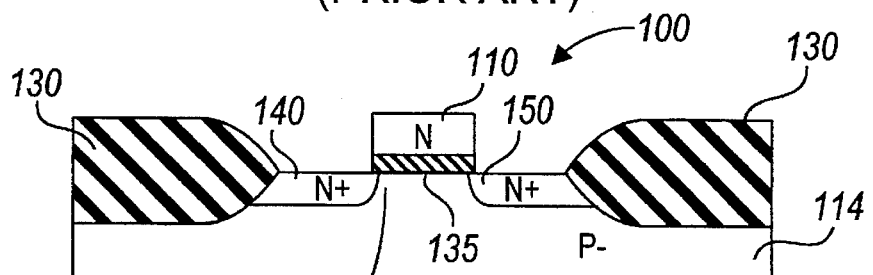
Figure 2D:
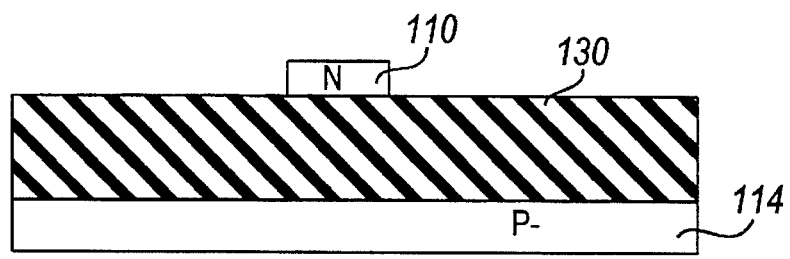
Figure 3:
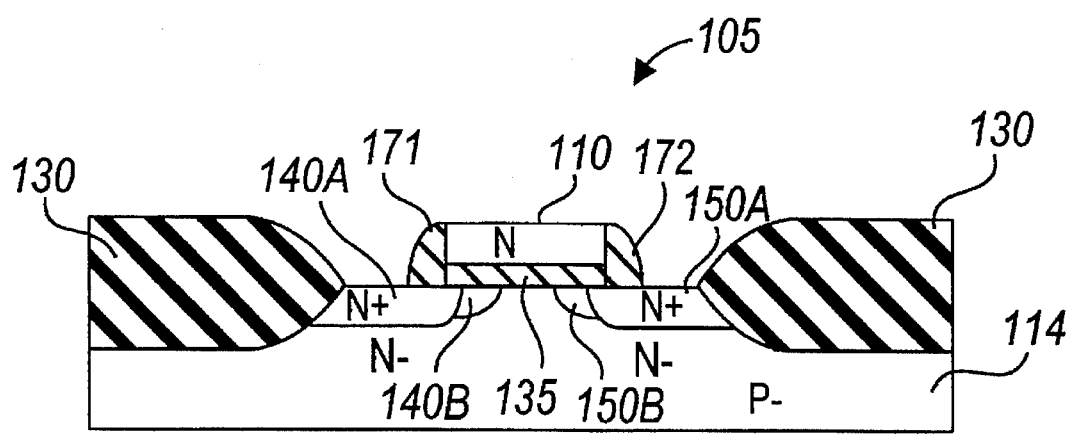
FIG. 3 is a cross-sectional view of a conventional lightly doped drain n-channel field effect transistor.

|  | Transistor 100 (FIG. 1) | Transistor 200 (FIG. 4) |
| --- | --- | --- |
| Gate width | $W_G$ (along 110a) | $W_G$ (along 210a) |
| Gate length | $L_G$ (along 110b) | $L_G$ (along 210b) |
| Source/Drain width | $W_{SD}$ (along 121a) | $W_{SD}$ (along 290a) |
| Source/Drain length | $L_{SD}$ (along 121d) | $L_{SD}$ (along 221d) |
| Overlap area | $W_{SD} \times L_G$ | $W_G \times L_G$ |
| Overlap area increase | — | $(W_G - W_{SD}) \times L_G$ |
| Cell layout area | $W_G \times L_{SD}$ | $W_G \times L_{SD}$ |

While transistors 100 and 200 have the same cell layout area, transistor 200 exhibits a greater capacitance because the area of overlap between gate electrode 210 and active region 220 is greater than the area of overlap between gate electrode 110 and active region 120. Consequently, the capacitance per cell layout area of transistor 200 is greater than that of transistor 100. In a typical MOS transistor having a gate width ($W_G$) of approximately 3.2 microns and a source/drain width ($W_{SD}$) of approximately 2 microns, the area of overlap is increased approximately 60% by utilizing the structure set forth above in connection with transistor 200. This results in a corresponding capacitance increase of approximately 60%.

Transistor 200 can have other dimensions, consistent with the desired transistor characteristics. For example, the dimensions of gate electrode 210, source region 240 and drain region 250 of transistor 200 can be made smaller than the dimensions of the corresponding elements in transistor 100. In such an embodiment, it is possible for transistor 200 to have a cell layout area which is less than the cell layout area of transistor 100 and a capacitance which is equal to or greater than the capacitance of transistor 100.

FIGS. 6A, 6B, 6C, 6D and 6E are cross-sectional views taken through plane 5C—5C of FIG. 4 for illustrating process steps used to fabricate transistor 200 of FIGS. 4 and 5A–5D. Similarly, FIGS. 7A, 7B, 7C, 7D and 7E are cross-sectional views taken through plane 5A—5A of FIG. 4 during the process steps illustrated in FIGS. 6A, 6B, 6C, 6D and 6E, respectively. Unless otherwise noted, the process steps described below are performed using conventional methods.

Figure 6A:
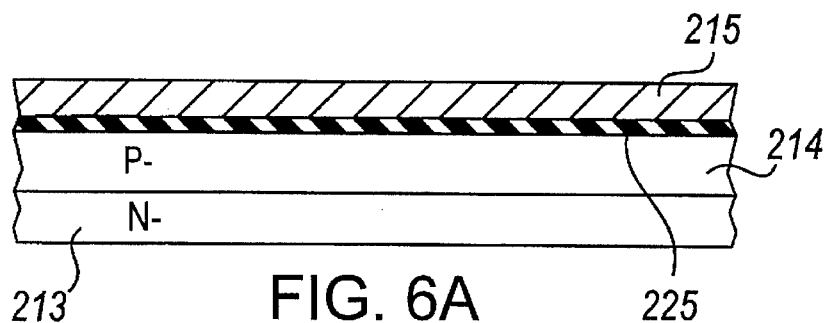
FIGS. 6A, 6B, 6C, 6D, and 6E are cross-sectional views through plane 5C—5C of FIG. 4 showing process steps for fabricating the transistor of FIG. 4.
Figure 6B:
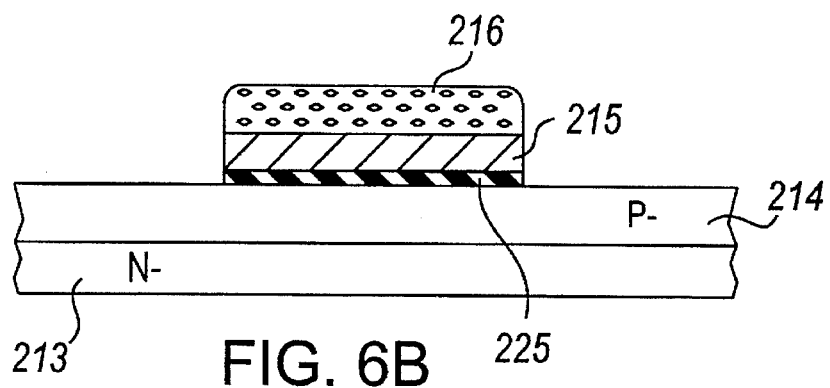
Figure 6C:
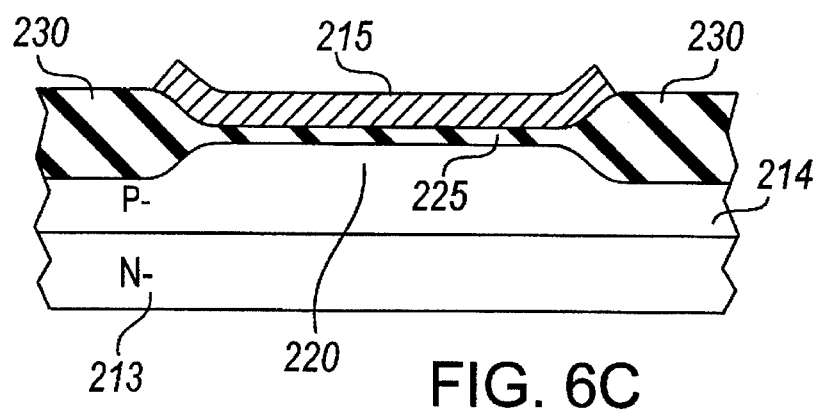
Figure 7A:
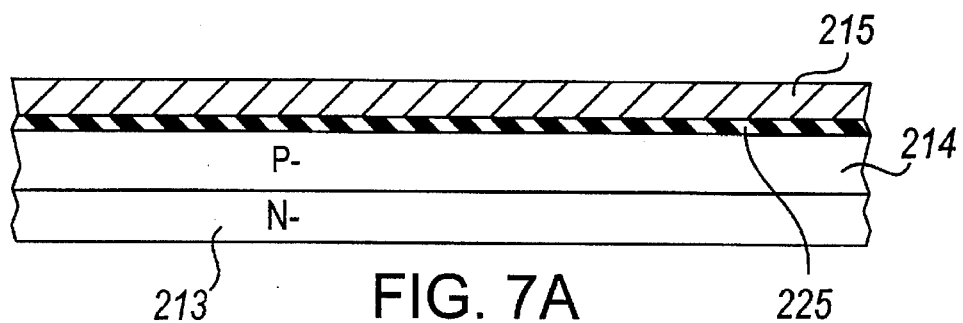
FIGS. 7A, 7B, 7C, 7D and 7E are cross-sectional views through plane 5A—5A of FIG. 4 showing process steps for fabricating the transistor of FIG. 4.
Figure 7B:
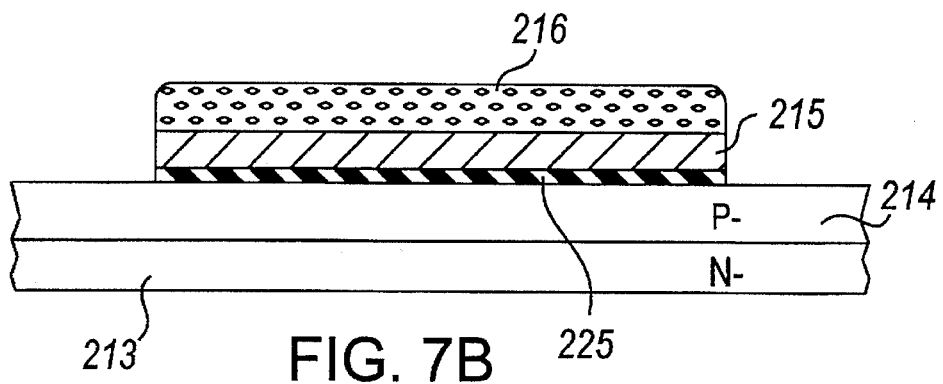
Figure 7C:
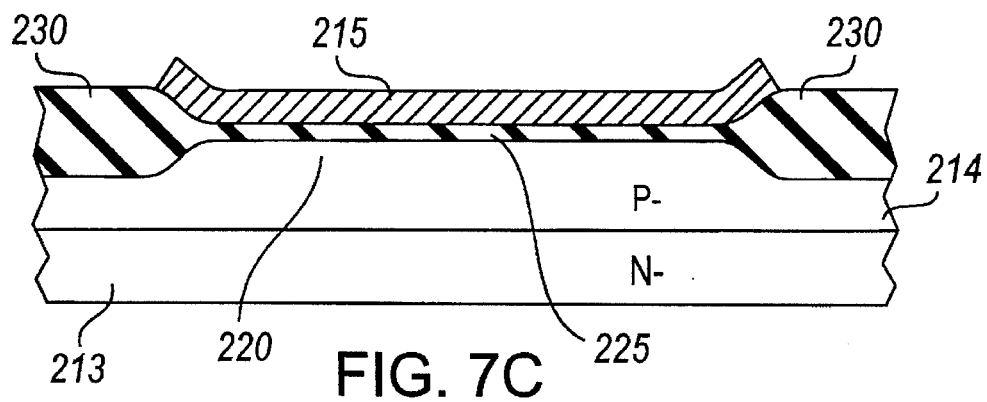

As shown in FIGS. 6A and 7A, a thin pad oxide layer 225 and a silicon nitride layer 215 are formed over the upper surface of P-well region 214. In one embodiment, oxide layer 225 has a thickness of approximately 100–400 Å, silicon nitride layer 215 has a thicknesses of approximately 1000–2000 Å, P-well region 214 has a net dopant concentration of approximately 1E15–1E17 atoms/cm$^3$ and substrate 213 has a net dopant concentration of approximately 1E14–1E15 atoms/cm$^3$.

A first photoresist mask 216 that defines active region 220 is then formed over nitride layer 215. The portions of nitride layer 215 and oxide layer 225 not covered by photoresist mask 216 are etched away, resulting in the structure illustrated in FIGS. 6B and 7B.

Photoresist mask 216 is removed. The remaining nitride layer 215 is used as a mask as a thick field oxide layer 230 is thermally grown to a thickness of approximately 3000–7000 Å, resulting in the structure shown in FIGS. 6C and 7C.

Nitride layer 215 and pad oxide layer 225 are then stripped away. A gate oxide layer 235, typically silicon dioxide, is thermally grown along the upper surface of P-well region 214 in active region 220 until gate oxide layer 235 has a thickness of approximately 80–200 Å.

Figure 6D:
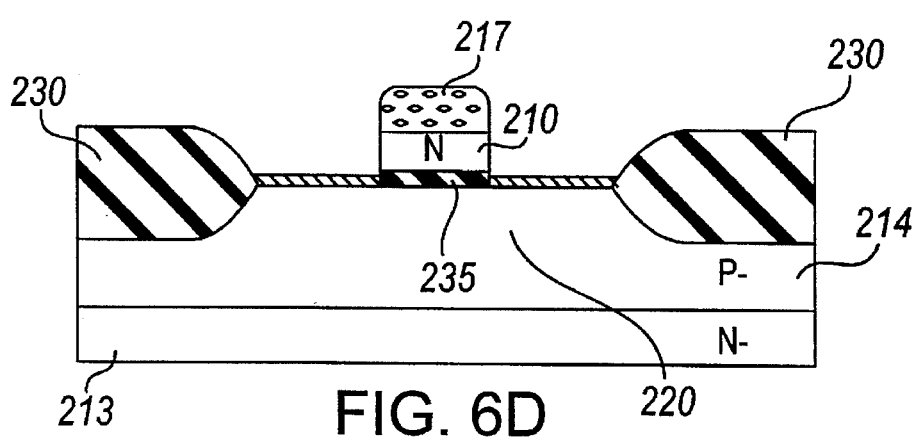
Figure 7D:
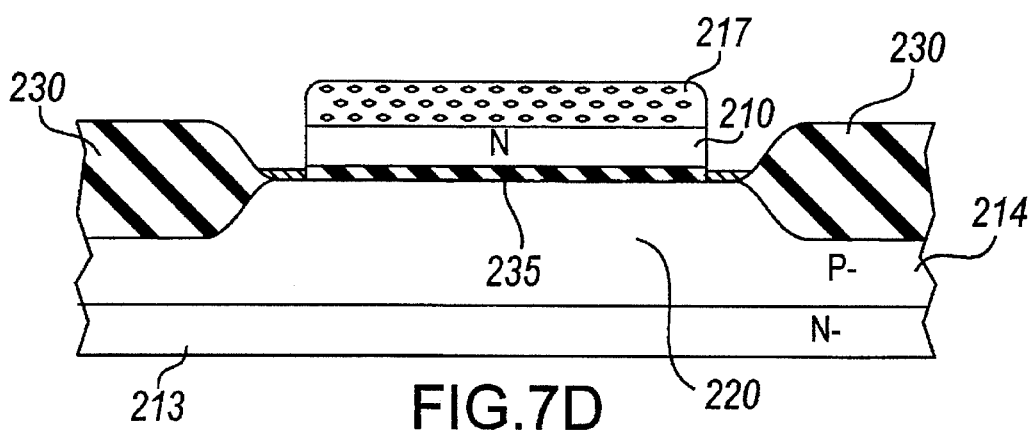

A layer of gate electrode material is deposited over gate oxide layer 235. The gate electrode material is conductive material, such as n-type polysilicon, having a sheet resistance of 35 ohms/square and a thickness of approximately 3000–4000 Å. A second photoresist mask 217 is then formed over the layer of gate electrode material. An etch is performed to remove the portions of the layer of gate electrode material not covered by mask 217. In this manner, the second photoresist mask 217 defines gate electrode 210 as illustrated in FIGS. 6D and 7D. The portions of gate oxide layer 235 not covered by gate electrode 210 are typically left substantially intact as shown in FIG. 6D. In a typical embodiment, the portion gate oxide layer 235 covered by gate electrode 210 is approximately 50 Å thicker than the portions of gate oxide layer 235 which are not covered by gate electrode 210. Gate electrode 210 is situated over the upper surface of active region 220 such that gate electrode 210 is laterally separately from sides 221a–221d of boundary 221 which defines active region 220.

Figure 6E:
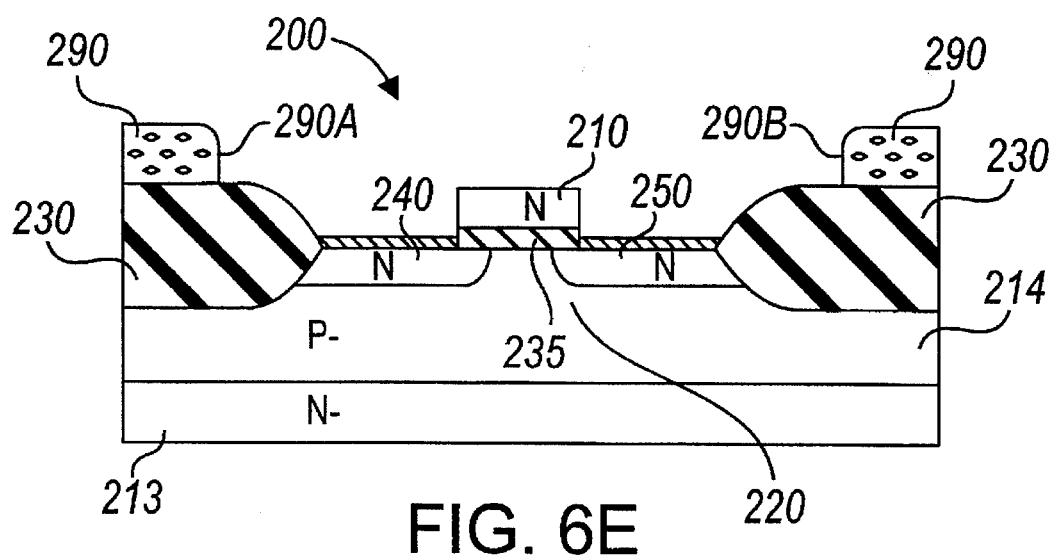
Figure 7E:
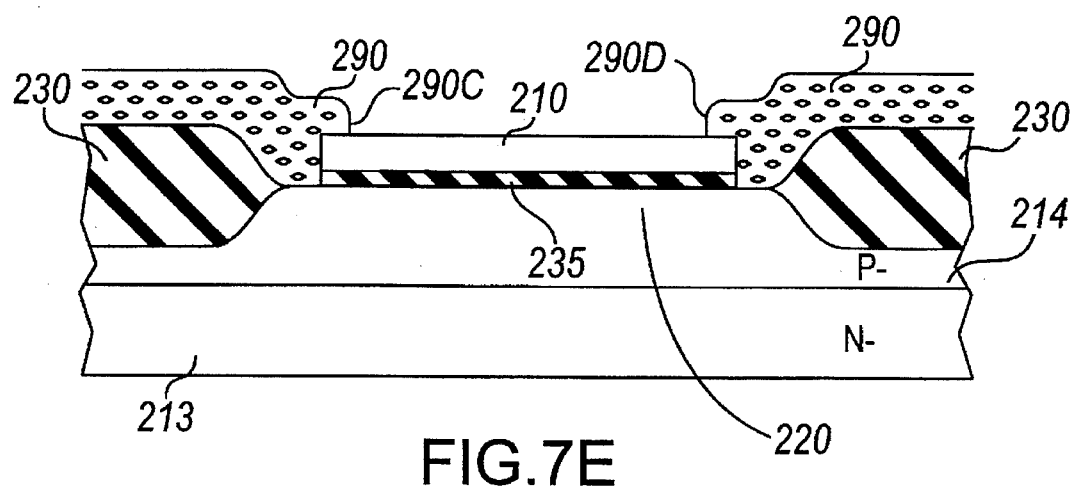

Referring now to FIGS. 6E and 7E, photoresist mask 217 is stripped and source/drain photoresist mask 290 is formed on the top of the resulting structure. Critical opposing edges 290c and 290d of source/drain mask 290 are positioned such that source/drain mask 290 covers opposing end portions of active region 220 and opposing ends of gate electrode 210. See, FIGS. 4 and 7E. Non-critical opposing edges 290a and 290b of source/drain mask 290 are positioned over field oxide layer 230 outside of active region 220. See, FIGS. 4 and 6E.

After source/drain mask 290 has been created, an n-type ion implantation step is performed. During this n-type ion implantation, the lateral areas occupied by source region 240 and drain region 250 are defined by a composite mask formed by critical edges 290c and 290d of source/drain mask 290, field oxide layer 230, and gate electrode 210. Critical edges 290c and 290d prevent an electrical path from being formed between source region 240 and drain region 250 around the perimeter of gate electrode 210. During the n-type ion implantation, field oxide 230, and not non-critical edges 290a and 290b, defines the outer edges of source region 240 and drain region 250.

In one embodiment, the n-type ion implantation step includes implanting arsenic at a dosage of 1-5E15 ions/$cm^2$ and an energy of 50–150 KeV. A annealing step is then performed to activate the implanted n-type dopant and form the final profiles for source and drain regions 240 and 250. Source and drain regions 240 and 250 extend under gate electrode 210. The total anneal is performed for approximately 90–150 minutes at 800°–900° C.

Fabrication of transistor 200 is completed in a generally conventional way. Dielectric material (not shown) is deposited on top of the structure. Contact openings are selectively etched through the dielectric material and any underlying silicon oxide down to gate electrode 210, source region 240, and drain region 250. One or more patterned layers of polycrystalline silicon (not shown) may be formed over the dielectric material to form other circuit elements such as resistors or thin film transistors. A patterned metallic layer (not shown) is subsequently provided to contact gate electrode 210, source region 240 and drain region 250 through the contact openings. Finally, a passivation layer (not shown) is deposited and selectively etched to expose bond pads.

Figure 8A:
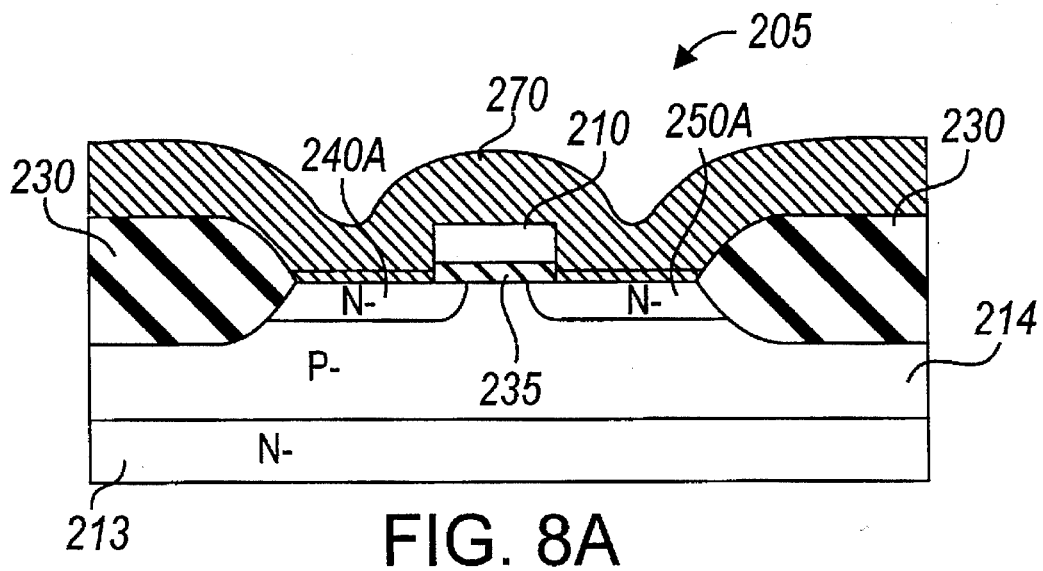
FIGS. 8A and 8B are cross-sectional views through plane 5C—5C of FIG. 4 showing additional process steps for fabricating an alternate embodiment of the transistor of FIG. 4.
Figure 8B:
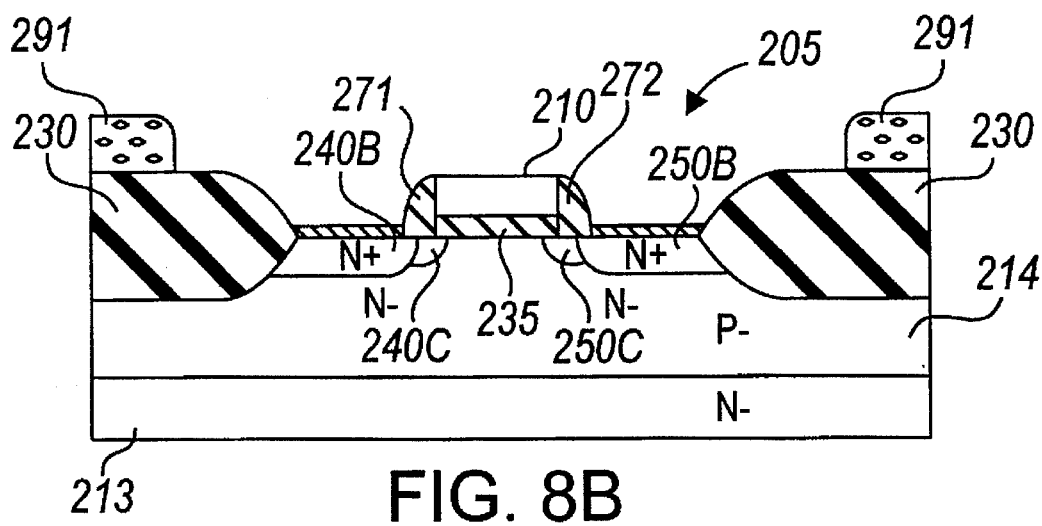

FIGS. 8A and 8B are cross sectional views of an LDD field-effect transistor 205 in accordance with an alternative embodiment of the present invention. LDD transistor 205 is a variation of transistor 200. The cross sectional views of FIGS. 8A and 8B roughly correspond to plane 5C—5C of FIG. 4. Thus, in one embodiment of transistor 205, substrate 213, P-well region 214, field oxide layer 230, gate oxide layer 235, gate electrode 210 and source/drain mask 290 are formed as previously described in connection with transistor 200. However, to create transistor 205, a light n-type ion implantation step is performed using source/drain mask 290 and gate electrode 210 to define the lateral areas for lightly doped source region 240a and lightly doped drain region 250a (FIG. 8A). The n-ion implantation step is typically done with phosphorous at a dosage of 1-5E13 ions/$cm^2$ and an energy of 30–60 KeV.

After performing the n– ion implantation, source/drain mask 290 is removed. An anneal is then performed for approximately 30 minutes at 800°–950° C. Next, a blanket oxide layer 270 having a thickness of approximately 2000–4000 Å is formed over the top of the resulting structure as shown in FIG. 8A. An anisotropic etch of oxide layer 270 is then performed in a conventional manner to expose gate electrode 210 and form oxide spacers 271 and 272 along the sides of gate electrode 210 as shown in FIG. 8B.

A second source/drain photoresist mask 291, substantially identical to source/drain mask 290, is formed on top of the resulting structure. A heavy n-type ion implantation step is subsequently performed into regions intended for heavily doped source and drain regions 240b and 250b. The n+ ion implantation is typically done with arsenic at a dosage of 1-5E15 ions/$cm^2$ and an energy of 50–150 KeV. During the n+ ion implantation, portions of lightly doped source and drain regions 240a and 250a are masked by oxide spacers 271 and 272, respectively. Consequently, these portions do not receive n-type dopant during the n+ ion implantation. As a result, lightly doped source extension region 240c and lightly doped drain extension region 250c are defined (FIG. 8B). Lightly doped drain extension region 250c is necessary to obtain the desired operation of LDD transistor 205.

Lightly doped source extension region 240c can be heavily doped (n+) in alternate embodiments. Thus, it is not necessary to form oxide spacer 271 during the above-described process. However, lightly doped source extension region 240c is created because it is convenient to form oxide spacer 271 at the same time as oxide spacer 272. Although lightly doped source extension region 240c could be a heavily doped region by eliminating oxide spacer 271, doing so would require additional process steps. Hence, an LDD transistor having only a drain extension region comes within the scope of the present invention. The preceding comments apply equally to the LDD transistors subsequently described.

After the locations for heavily doped source and drain regions 240b and 250b are defined, oxide spacers 271 and 272 and Second source/drain mask 291 are stripped and a annealing step is performed to activate the dopant, thereby forming source regions 240a–240c and drain regions 250a–250c. An anneal is then performed to activate the implant. The total anneal is typically performed for 90–150 minutes at 800°–900° C. In fabricating transistor 205, or any of the LDD transistors described herein, an anneal can be performed after each n-type ion implantation as described above, or an anneal can be performed after both n-type ion implantations are performed. In either case, lightly doped source and drain regions 240c and 250c extend below gate electrode 210. The fabrication of transistor 205 is completed in the manner described above for transistor 200.

FIGS. 9 and 10A–10E depict an alternative embodiment of the present invention in which an LDD n-channel field effect transistor 300 is formed using two source/drain photoresist masks 390, 395 having different dimensions. The process for fabricating transistor 300 is similar to the process described above in connection with transistor 205. That is, substrate 313, P-well region 314, gate oxide layer 335, field oxide 330 and gate electrode 310 are formed using methods as previously described connection with transistor 205. Active region 320 is defined by boundary 321 of field oxide layer 330. Boundary 321 includes sides 321a–321d. The entire gate electrode 310 is positioned over active region 320 and is laterally separated from boundary 321. Gate electrode 310 has a width along side 310a and a length along side 310b.

The source/drain photoresist masks 390, 395 used to define the source and drain regions within transistor 300 are offset with respect to each other, instead of being identical like source/drain masks 290, 291 used to fabricate transistor 205. The dimensions of source/drain masks 390 and 395 are indicated by dashed lines in the top view of FIG. 9.

Figure 9:
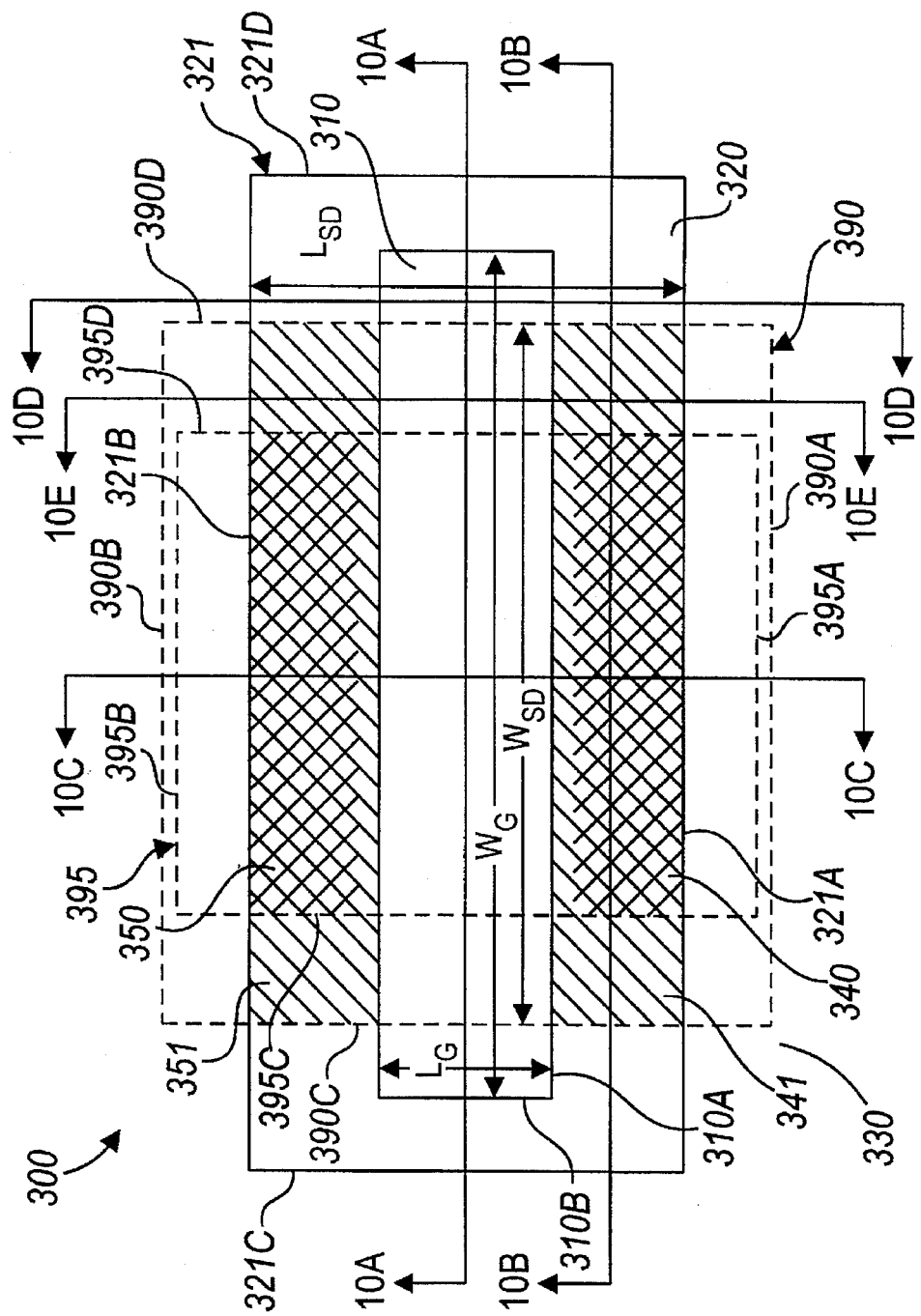
FIG. 9 is a top view of another embodiment of a high capacitance n-channel field effect transistor in accordance with the invention.
Figure 10A:
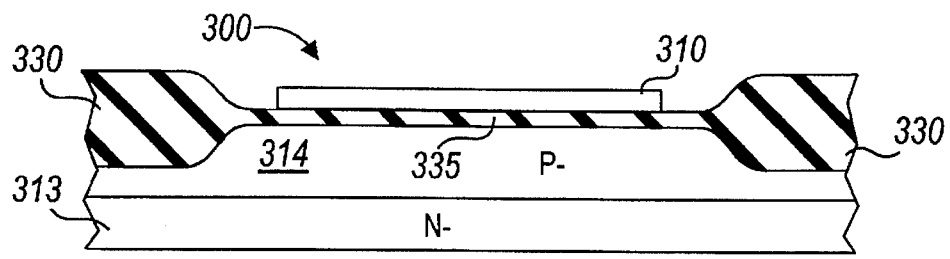
FIGS. 10A–10E are crossesectional views of the transistor of FIG. 9 through planes 10A—10A, 10B—10B, 10C—10C, 10D—10D, and 10E—10E, respectively, of FIG. 9.
Figure 10B:
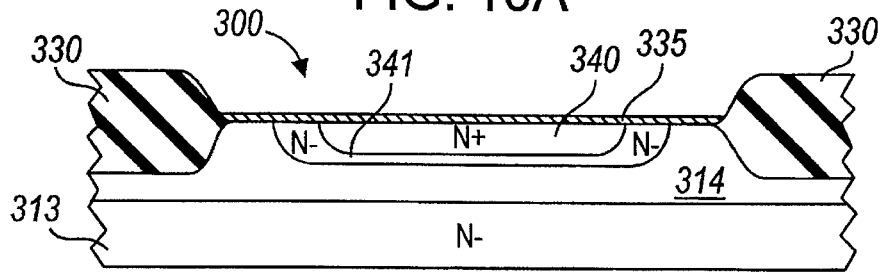
Figure 10C:
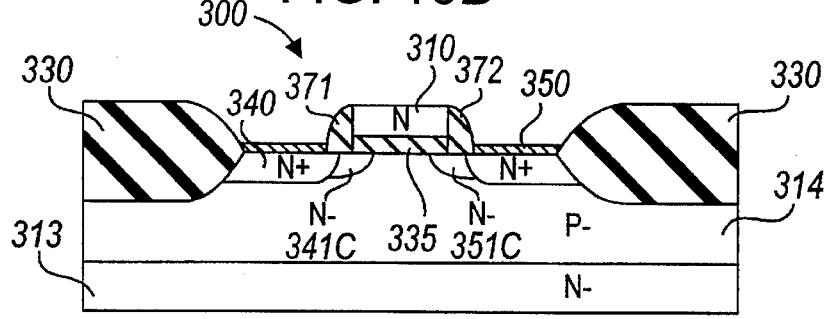
Figure 10D:
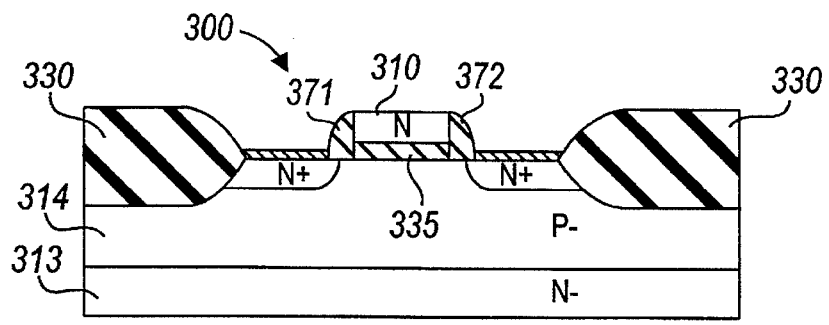
Figure 10E:
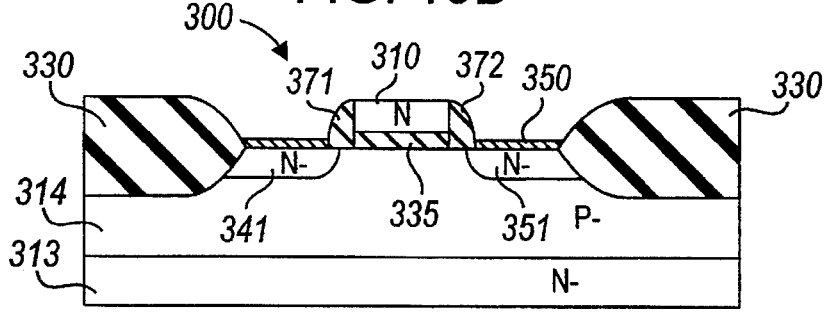

To create transistor 300, source/drain mask 390 is formed as illustrated in FIG. 9. Source/drain mask 390 has non-critical opposing edges 390a and 390b and critical opposing edges 390c and 390d. Critical opposing edges 390c and 390d, along with field oxide 330 and gate electrode 310, partially define the lateral areas for source region 341 and drain region 351 in active region 320. A light n-type ion implantation is performed through mask 390, into the regions intended for lightly doped source and drain regions 341 and 351, respectively. Source/drain mask 390 is subsequently stripped and oxide spacers 371 and 372 (FIG. 10C–10E) are formed using, for example, the method previously described in connection with FIGS. 8A and 8B.

Source/drain mask 395 is then formed as illustrated in FIG. 9. Source/drain mask 395 has non-critical opposing edges 395a and 395b and critical opposing edges 395c and 395d. Critical opposing edges 395c and 395d, along with field oxide 330 and gate electrode 310, define the lateral areas for source region 340 and drain region 350 in active region 320. A heavy n-type ion implantation is performed through mask 395 into the regions intended for heavily doped source and drain regions 340 and 350, respectively.

During the n+ ion implantation, oxide spacers 371 and 372 prevent the just-implanted n-type dopant from reaching the portions of lightly doped source and drain regions 341, 351 which are positioned beneath oxide spacers 371–372 and adjacent to gate electrode 310. This completes the definition of the lateral areas occupied by lightly doped source and lightly doped drain extension regions 341c and 351c (FIG. 10C), respectively, which extend along gate electrode 310 for a length approximately equal to the length of non-critical opposing edge 390a (or 390b) of mask 390. An annealing step is then performed to activate the implanted n-type impurities and form the final profiles for source and drain regions 340, 341, 350 and 351. The implantation and annealing steps are performed at approximately the same process parameters as those used in the corresponding steps used in fabricating transistor 200. Likewise, fabrication of transistor 300 is completed in the manner described above for transistor 200.

In one embodiment, gate electrode 310, source region 341 and drain region 351 of transistor 300 have the same dimensions as gate electrode 110, source region 140 and drain region 150 of transistor 100. Table 2 sets forth a comparison between the transistors 100 and 300 in such an embodiment.

TABLE 2

|  | Transistor 100 (FIG. 1) | Transistor 300 (FIG. 9) |
| --- | --- | --- |
| Gate width | $W_G$ (along 110a) | $W_G$ (along 310a) |
| Gate length | $L_G$ (along 110b) | $L_G$ (along 310b) |
| Source/Drain width | $W_{SD}$ (along 121a) | $W_{SD}$ (along 390a) |
| Source/Drain length | $L_{SD}$ (along 121d) | $L_{SD}$ (along 321d) |
| Overlap area | $W_{SD} \times L_G$ | $W_G \times L_G$ |
| Overlap area increase | — | $(W_G - W_{SD}) \times L_G$ |
| Cell layout area | $W_G \times L_{SD}$ | $W_G \times L_{SD}$ |

While transistors 100 and 300 have the same cell layout area, transistor 300 exhibits a greater capacitance because the area of overlap between gate electrode 310 and active region 320 is greater than the area of overlap between gate electrode 110 and active region 120. Consequently, the capacitance per cell layout area of transistor 300 is greater than that of transistor 100.

Transistor 300 has a graded junction near the ends of gate electrode 310. That is, the n-type dopant concentration of the source and drain regions decreases near the ends of gate electrode 310. This graded junction increases the breakdown voltage and reduces the leakage current associated with transistor 300.

Figure 11:
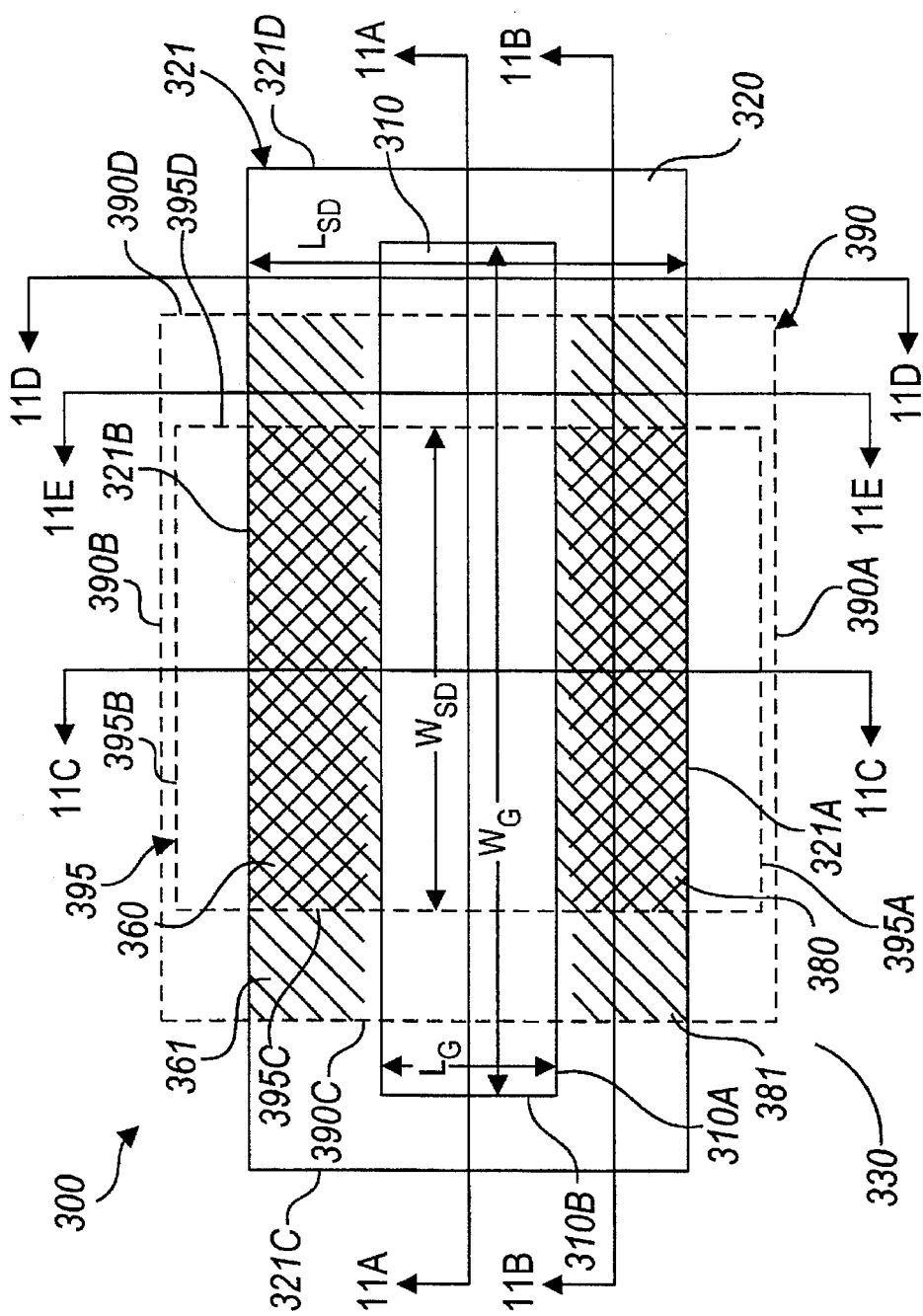
FIG. 11 is a top view of a transistor in accordance with an alternate embodiment of the present invention.
Figure 11A:
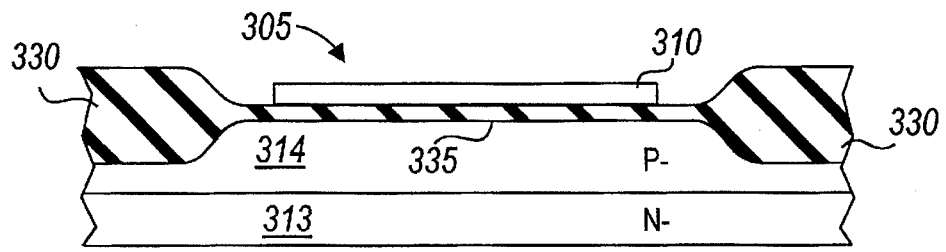
FIGS. 11A–11E are cross sectional views through section lines 11A—11A, 11B—11B, 11C—11C, 11D—11D and 11—E—11E of FIG. 11.
Figure 11B:
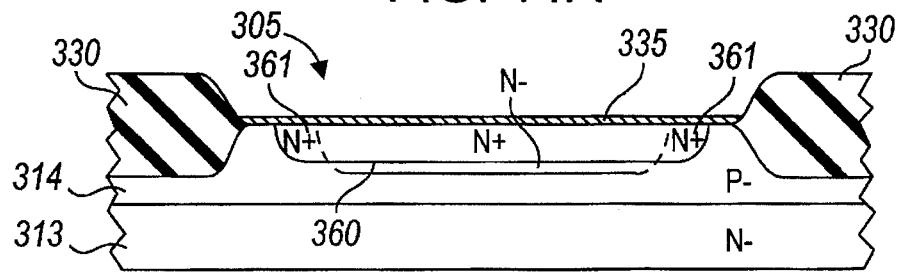
Figure 11C:
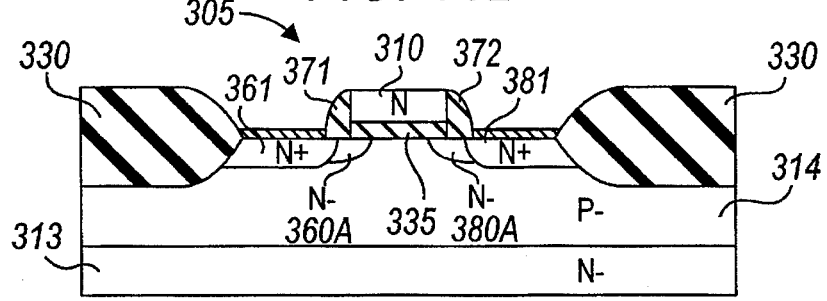
Figure 11D:
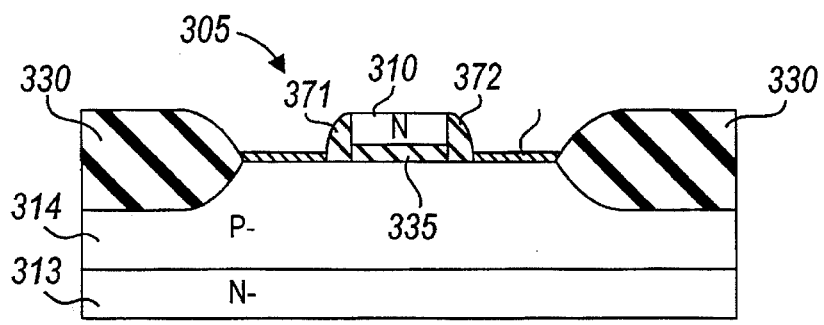
Figure 11E:
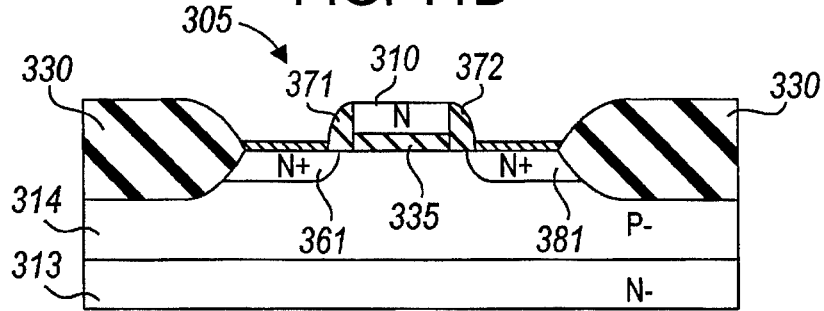

FIG. 11 is a top view of a transistor 305 in accordance with an alternate embodiment of the present invention. FIGS. 11A–11E are cross sectional views through section lines 11A—11A, 11B—11B, 11C—11C, 11D—11D and 11E—11E of FIG. 11. Transistor 305 is an LDD n-channel field effect transistor which is similar to transistor 300. Transistor 305 is formed by interchanging the source/drain masks 390 and 395 used to fabricate transistor 300. Because the process steps used to create transistor 305 are similar to those used to create transistor 300, similar numbers in FIGS. 9, 10A–10E, 11 and 11A–11E represent similar elements.

To fabricate transistor 305, source/drain mask 395 is formed as illustrated in FIG. 11. A light n-type ion implantation is performed through mask 395 into the regions for lightly doped source and drain regions 360 and 380, respectively.

Source/drain mask 395 is then stripped and oxide spacers 371 and 372 are formed as previously described. Source/drain mask 390 is then formed as illustrated in FIG. 11 after which a heavy n-type ion implantation is performed into the regions for heavily doped source and drain regions 361 and 381, respectively.

As previously discussed, oxide spacers 371 and 372 complete the definition of lightly doped source and lightly doped drain extension regions 360a and 380a (FIG. 11C), respectively, which extend along gate electrode 310 for a distance approximately equal to the length of non-critical edge 390a (or 390b) of mask 390. A annealing step is then performed to activate the implanted n-type impurity, thereby forming the final profiles for source and drain regions 360, 361, 380 and 381. Lightly doped source and drain regions 360a and 380a extend under gate electrode 310. The implantation and annealing steps are performed at approximately the same process parameters as those used in the corresponding steps used in fabricating transistor 205. Likewise, fabrication of transistor 305 is completed in the manner described above for transistor 205.

In one embodiment, gate electrode 310, source region 360 and drain region 380 of transistor 305 are the same size as gate electrode 110, source region 140 and drain region 150 of transistor 100. Table 3 sets forth a comparison between the transistors 100 and 305 in such an embodiment.

TABLE 3

|  | Transistor 100 (FIG. 1) | Transistor 305 (FIG. 9) |
| --- | --- | --- |
| Gate width | $W_G$ (along 110a) | $W_G$ (along 310a) |
| Gate length | $L_G$ (along 110b) | $L_G$ (along 310b) |
| Source/Drain width | $W_{SD}$ (along 121a) | $W_{SD}$ (along 395a) |
| Source/Drain length | $L_{SD}$ (along 121d) | $L_{SD}$ (along 321d) |
| Overlap area | $W_{SD} \times L_G$ | $W_G \times L_G$ |
| Overlap area increase | — | $(W_G - W_{SD}) \times L_G$ |
| Cell layout area | $W_G \times L_{SD}$ | $W_G \times L_{SD}$ |

While transistors 100 and 305 have the same cell layout area, transistor 305 exhibits a greater capacitance.

Figure 12:
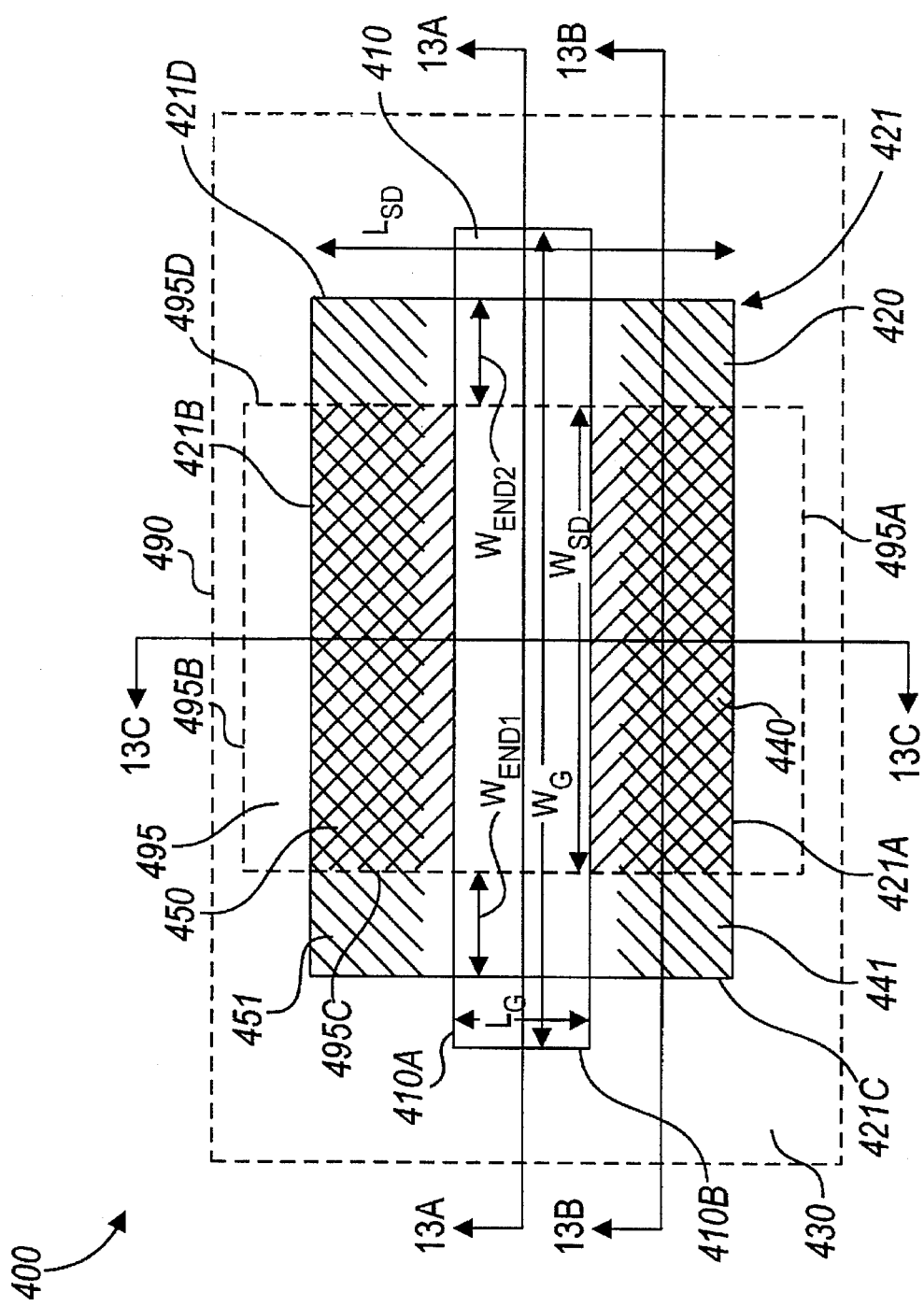
FIG. 12 is a top view of another embodiment of a high capacitance MOS transistor in accordance with the invention.
Figure 13A:
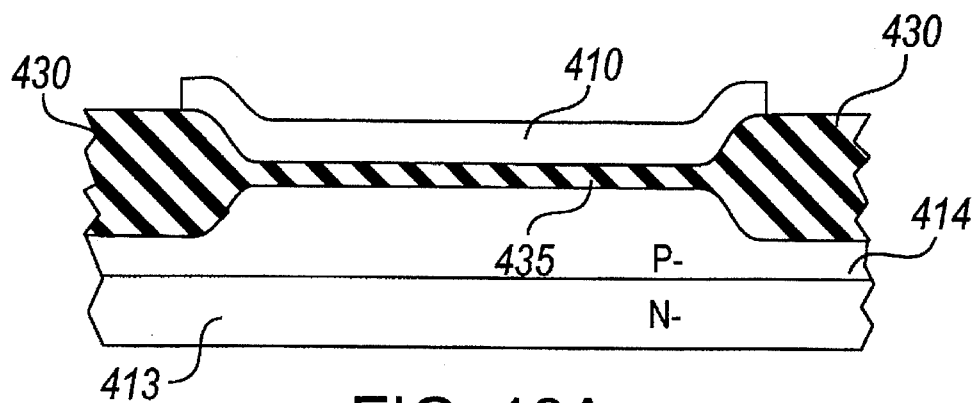
FIGS. 13A, 13B and 13C are cross-sectional views of the transistor of FIG. 12 through planes 13A—13A, 13B—13B and 13C—13C, respectively, of FIG. 12.
Figure 13B:
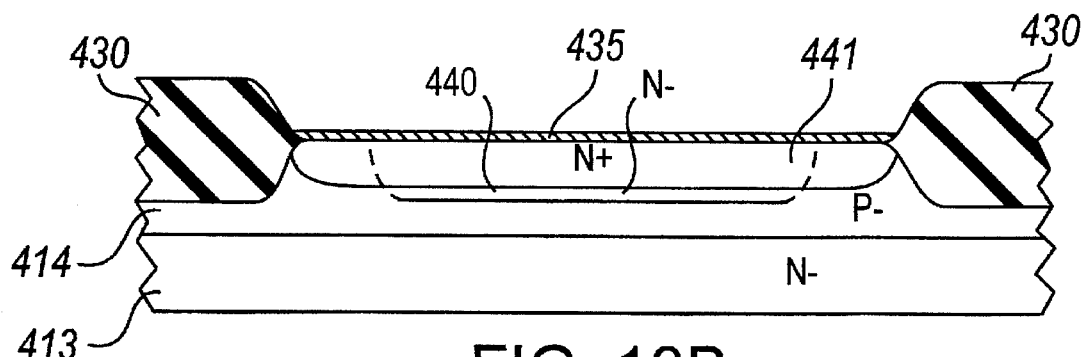
Figure 13C:
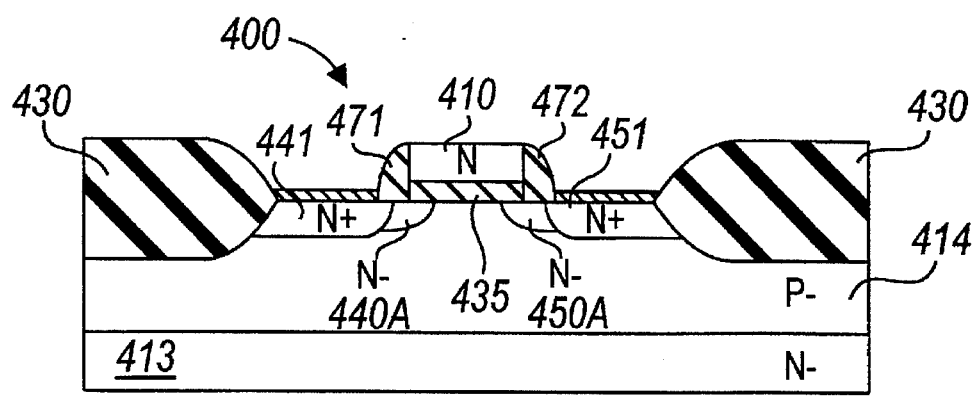

FIGS. 12 and 13A–13C illustrate an LDD n-channel field effect transistor 400 in accordance with another embodiment of the present invention. FIG. 12 is a top view of transistor 400. FIGS. 13A, 13B and 13C are cross-sectional views of transistor 400 through planes 13A—13A, 13B—13B and 13C—13C, respectively of FIG. 12.

Transistor 400 is fabricated using process steps similar to those previously described in connection with transistors 200, 205, 300, and 305. Field oxide layer 430, gate oxide layer 435 and gate electrode 410 are formed on P-well region 414 and substrate 413. Field oxide layer 430 has a boundary 421 that defines the active region 420 of transistor 400. Boundary 421 includes sides 421a–421d. Gate electrode 410, which is formed over gate oxide 435, has a width along side 410a and a length along side 410b. However, unlike transistors 200, 205, 300 and 305, gate electrode 410 of transistor 400 extends over field oxide layer 430 at opposing ends of active region 420. As described in more detail below, the amount which gate electrode 410 extends over field oxide 430 is less than the amount which gate electrode 110 of prior art transistor 100 extends over field oxide 130.

Transistor 400 is formed using non-critical source/drain photoresist mask 490 and critical source/drain photoresist mask 495. The locations of masks 490 and 495 are indicated by dashed lines in the top view of FIG. 12. Critical source/drain mask 495 is first formed as illustrated in FIG. 12. Source/drain mask 495 has non-critical opposing edges 495a and 495b and critical opposing edges 495c and 495d. Critical opposing edges. 495c and 495d, along with field oxide 430 and gate electrode 410, define the lateral areas occupied by source region 440 and drain region 450 in active region 420. A light n-type ion implantation is performed into the regions for lightly doped source and drain regions 440 and 450, respectively. Mask 495 is then stripped and oxide spacers 471 and 472 are formed as previously described.

Source/drain mask 490 is then formed as illustrated in FIG. 12. Because source/drain mask 490 has no edges within active region 420, mask 490 is a non-critical mask with respect to transistor 400. A heavy n-type in implantation is then performed, with field oxide layer 430 and gate electrode 410 defining the lateral areas of heavily doped source and drain regions 441 and 451, respectively. In the manner previously discussed, oxide spacers 471 and 472 define lightly doped source and drain extension regions 440a and 450a (FIG. 12C), respectively, which extend along gate electrode 410 for a distance approximately equal to the length of edge 495a (or 495b) of source/drain mask 495. The implantation and annealing steps are performed at approximately the same process parameters as those used in the corresponding steps used in fabricating transistor 205. Likewise, fabrication of transistor 400 is completed in the manner described above for transistor 205.

In one embodiment, gate electrode 410, source region 440 and drain region 450 of transistor 400 have the same dimensions as gate electrode 110, source region 140 and drain region 150 of transistor 100. In such an embodiment, the width of active region 420 is therefore equal to the width of active region 120 ($W_{SD}$) plus additional widths, $W_{END1}$ and $W_{END2}$. The sum of additional widths $W_{END1}$ and $W_{END2}$ is equal to the length of side 421a (of boundary 421) minus the length of side 495a (of mask 495). Table 4 sets forth a comparison between transistors 100 and 400 in such an embodiment.

the area of overlap between gate electrode 410 and active region 420 is greater than the area of overlap between gate electrode 110 and active region 120. Consequently, the capacitance per cell layout area of transistor 400 is greater than that of transistor 100.

The configuration of transistor 400 allows active region 420 to be extended closer to the ends of gate electrode 410 than was possible in the prior art. This is because the n+ ion implantation defines heavily doped n-type regions located near the ends of gate electrode 410 (shown in single-hatched shading in FIG. 12) act to prevent punch-through of transistor 400 around the ends of gate electrode 410. This extension of active region 420 results in an increase of capacitance in transistor 400.

Figure 14:
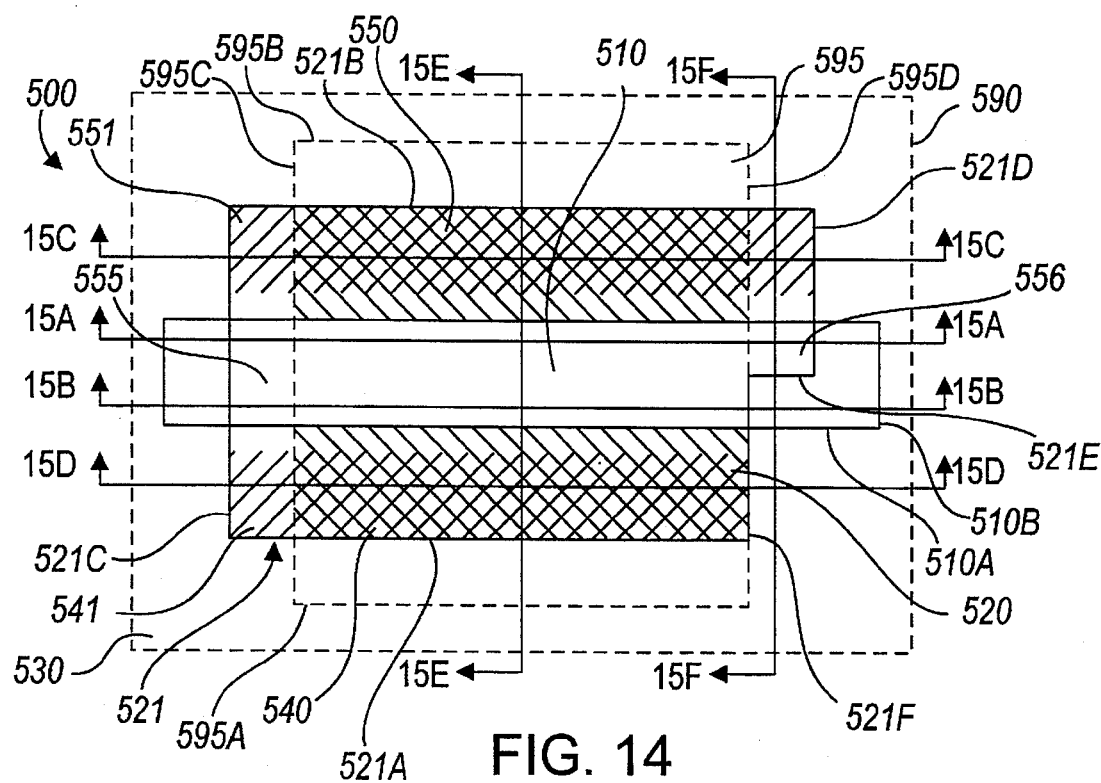
FIG. 14 is a top view of another embodiment of a high capacitance MOS transistor in accordance with the invention.

FIG. 14 is a top view of LDD n-channel field effect transistor 500 in accordance with yet another embodiment of the present invention. FIGS. 15A, 15B, 15C, 15D, 15E and 15F are cross sectional views of transistor 500. Field oxide 530, gate oxide 535 and gate electrode 510 are formed over P-well region 514 and substrate 513 as previously described. Field oxide 530 has a boundary 521 which defines active region 520 of transistor 500. Boundary 521 includes sides 521a–521f which connect to form the irregular, i.e., non-rectangular, shape of active region 520. In other embodiments, active region 520 can have other irregular shapes based on the geometry desired for the layout of transistor 500. Gate electrode 510 is formed over active region 520 as illustrated in FIG. 14. Gate electrode 510 has a width along side 510a and a length along side 510b.

Transistor 500 is formed using non-critical source/drain photoresist mask 590 and critical source/drain photoresist mask 595. The locations of masks 590 and 595 are indicated by dashed lines in the top view of FIG. 14. To create transistor 500, critical source/drain mask 595 is first formed as illustrated in FIG. 14. Source/drain mask 595 has non-critical opposing edges 595a and 595b and critical opposing edges 595c and 595d. Critical opposing edges 595c and 595d, along with field oxide 530 and gate electrode 510, define the lateral areas for source region 540 and drain region 550 in active region 520. A light n-type ion implantation is performed into the regions intended for lightly doped source and drain regions 540 and 550, respectively.

After then n– ion implantation is performed, source/drain mask 595 is stripped and oxide spacers 571 and 572 (FIGS. 15E and 15F) are formed. Non-critical source/drain mask 590 is then formed as illustrated in FIG. 14. A heavy n-type ion implantation is subsequently performed, with field oxide layer 530, gate electrode 510 and oxide spacers 571–572 defining the lateral areas for heavily doped source and drain regions 541 and 551, respectively. In the manner previously discussed, oxide spacers 571 and 572 complete the definition of lightly doped source and drain extension regions

TABLE 4

|  | Transistor 100 (FIG. 1) | Transistor 400 (FIG. 12) |
| --- | --- | --- |
| Gate width | $W_G$ (along 110a) | $W_G$ (along 410a) |
| Gate length | $L_G$ (along 110b) | $L_G$ (along 410b) |
| Source/Drain width | $W_{SD}$ (along 121a) | $W_{SD}$ (along 495a) |
| Source/Drain length | $L_{SD}$ (along 121d) | $L_{SD}$ (along 421d) |
| Active region width | $W_{SD}$ (along 121a) | $W_{SD} + W_{END1} + W_{END2}$ (421a) |
| Overlap area | $W_{SD} \times L_G$ | $(W_{SD} + W_{END1} + W_{END2}) \times L_G$ |
| Overlap area increase | — | $(W_{END1} + W_{END2}) \times L_G$ |
| Cell layout area | $W_G \times L_{SD}$ | $W_G \times L_{SD}$ |

Figure 15A:
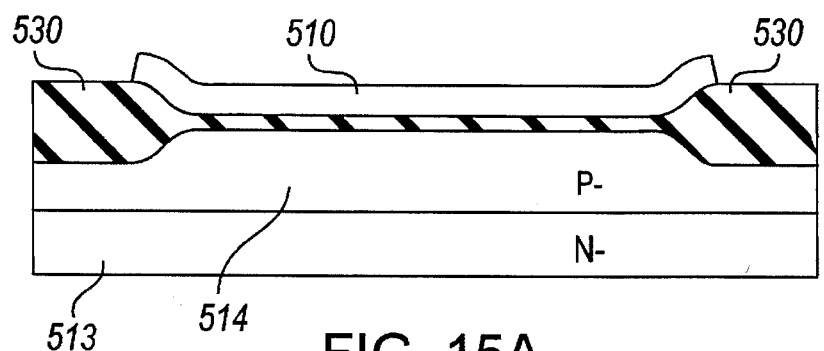
FIGS. 15A, 15B, 15C, 15D, 15E and 15F are cross-sectional views of the transistor of FIG. 14 through planes 15A—15A, 15B—15B, 15C—15C, 15D—15D, 15E—15E and 15F—15F, respectively, of FIG. 14.
Figure 15B:
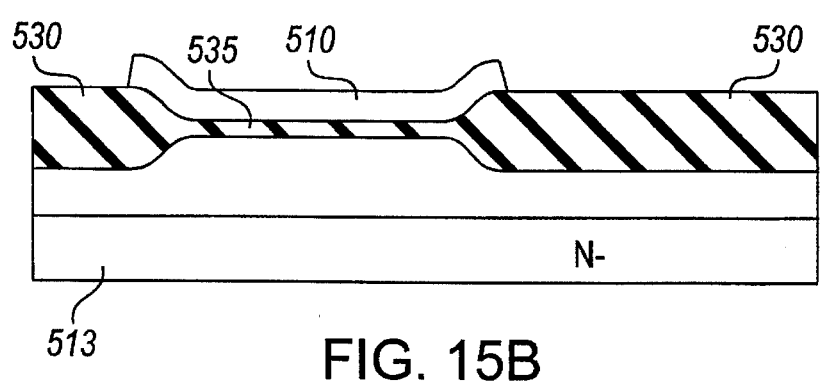
Figure 15C:
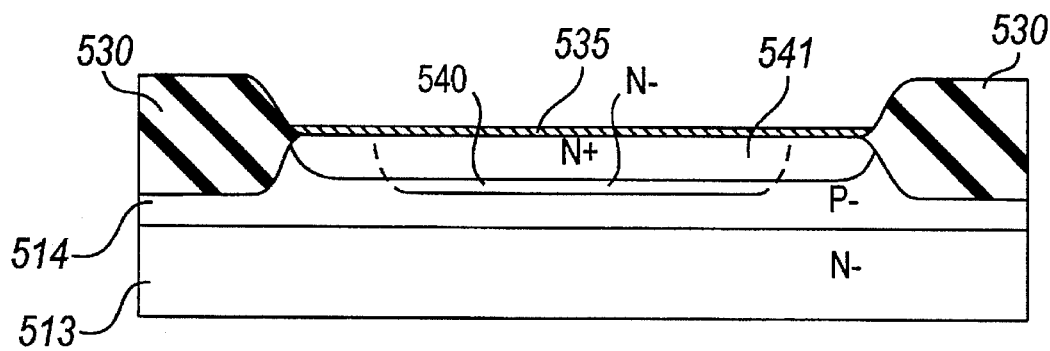
Figure 15D:
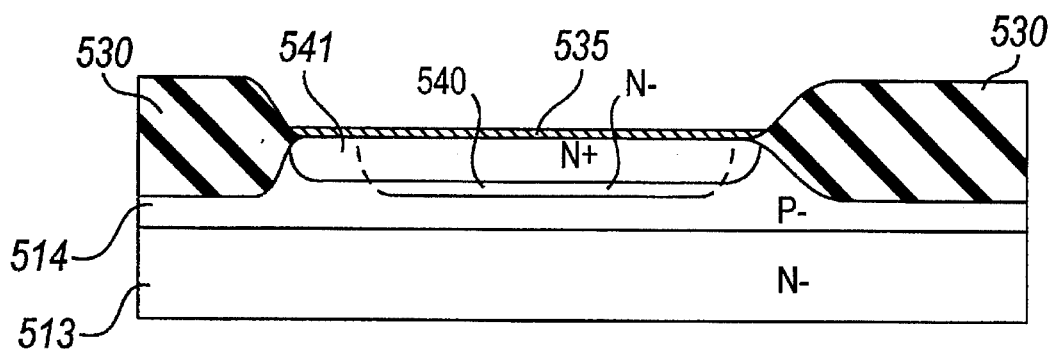
Figure 15E:
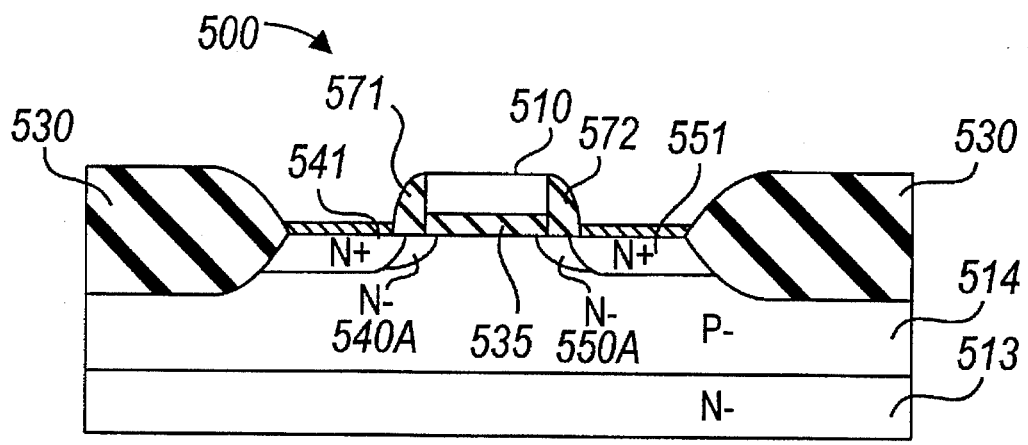
Figure 15F:
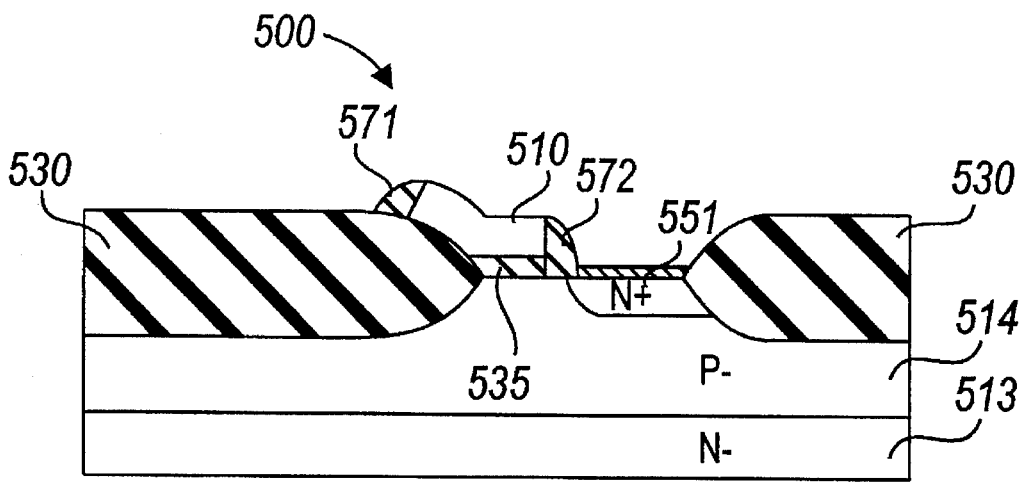

While transistors 100 and 400 have the same cell layout area, transistor 400 exhibits a greater capacitance because 540a and 550a (FIG. 15E). The implantation and annealing steps are performed at approximately the same process parameters as those used in the corresponding steps used in fabricating transistor 205. Likewise, fabrication of transistor 500 is completed in the manner-described above for transistor 205.

In one embodiment, gate electrode 510, source region 540 and drain region 550 of transistor 500 have the same dimensions as gate electrode 110, source region 140 and drain region 150 of transistor 100. In such an embodiment, transistors 100 and 500 have the same cell layout area. However, transistor 500 exhibits a greater capacitance than transistor 100 because the structure of transistor 500 has additional areas near each end of gate electrode 510 which are positioned over active region 520. The first additional area 555 is defined by a portion of side 521c, a portion of edge 595c and two portions of gate electrode 510 (FIG. 14). The second additional area 556 is defined by side 521e, a portion of edge 595d, a portion of gate electrode 510 and a portion of side 521d (FIG. 14). Consequently, the capacitance per cell layout area of transistor 500 is greater than that of transistor 100.

Figure 16:
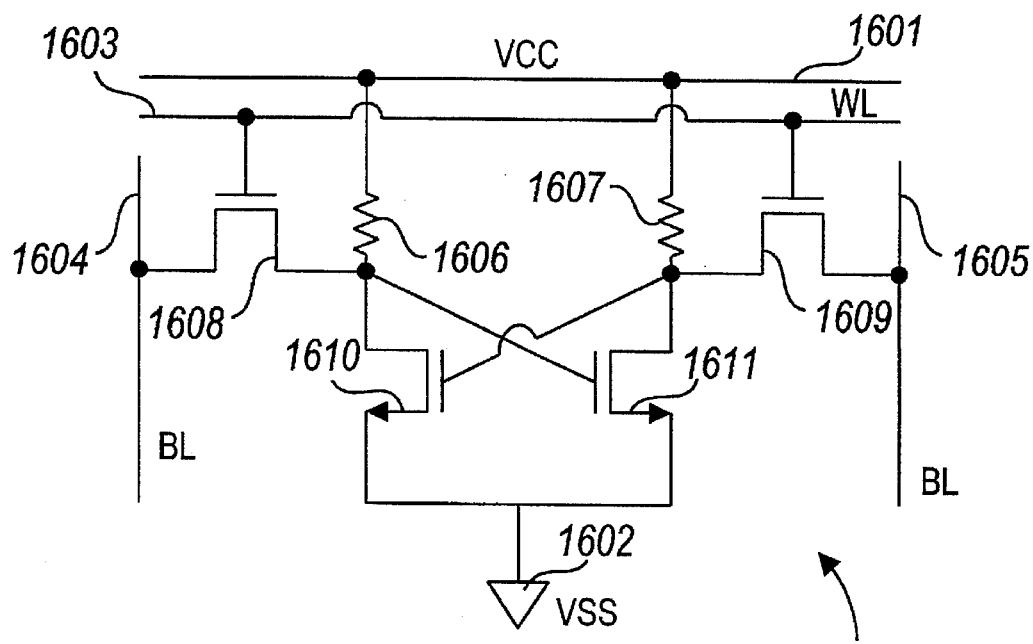
FIG. 16 is a schematic diagram of a four-transistor SRAM memory cell.

FIG. 16 is a schematic diagram of a four-transistor SRAM memory cell 1600 which includes first supply voltage 1601, second supply voltage 1602, word line 1603, bit lines 1604–1605, load resistors 1606–1607, access transistors 1608–1609, and cross-coupled storage transistors 1610–1611. In one application of the present invention, storage transistors 1610 and 1611 are transistors fabricated in accordance with the present invention. That is, transistors 1610 and 1611 are fabricated in a manner previously described in connection with transistor 200, 205, 300, 305, 400, or 500. In another embodiment, additional bit lines are added to SRAM memory cell using conventional methods.

Figure 17:
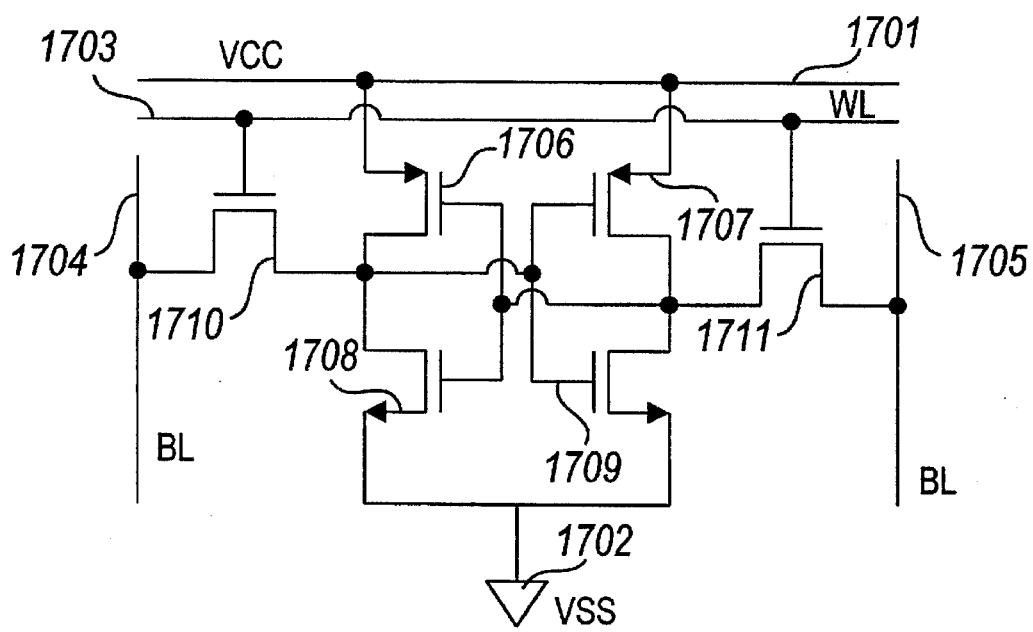
FIG. 17 is a schematic diagram of a six-transistor SRAM memory cell.

FIG. 17 is a schematic diagram of a six transistor SRAM memory cell 1700 which includes first supply voltage 1701, second supply voltage 1702, word line 1703, bit lines 1704–1705, load transistors 1706–1707, cross-coupled storage transistors 1708–1709, and access transistors 1710–1711. In one embodiment, storage transistors 1706–1709 are fabricated in a manner previously described in connection with transistor 200, 205, 300, 305, 400 or 500. In one embodiment, load transistors 1706 and 1707 are formed in the same substrate as storage transistors 1708 and 1709. In another embodiment, load transistors 1706 and 1707 are conventional thin film transistors fabricated in polysilicon layers which overlie the substrate in which storage transistors 1708 and 1709 are fabricated. In yet another embodiment, additional bit lines are added to SRAM memory cell 1700 using conventional techniques.

Figure 18:
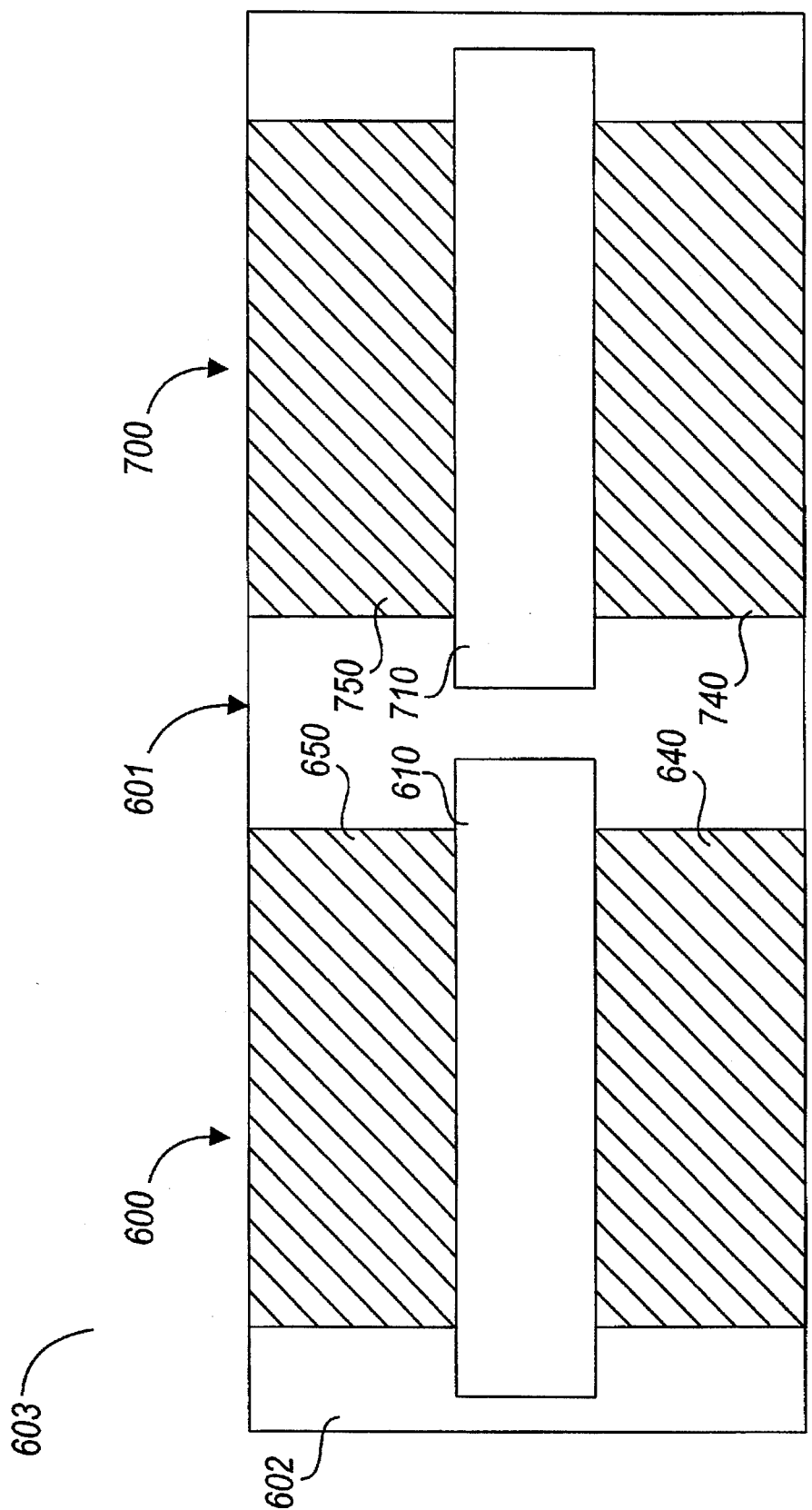
FIG. 18 is a top view of two transistors in accordance with one embodiment of the present invention.

FIG. 18 is a top view of two transistors in accordance with one embodiment of the present invention. Transistors 600 and 700 are fabricated within a region 601 formed on semiconductor substrate 602 by field oxide 603. Transistor 600 includes gate electrode 610, source 640 and drain 650. Transistor 700 includes gate electrode 710, source 740 and drain 750. Transistors 600 and 700 are fabricated in a manner similar to transistor 200. In alternate embodiments, transistors 600 and 700 can be fabricated as previously described in connection with transistors 205, 300, 305, 400 or 500. Even though no field oxide is present for laterally isolating transistors 600 and 700, the portion of substrate 602 located between these transistors effectively isolates these transistors from one another. Transistors 600–900 could, for example, be used in SRAM memory cells 1600 or 1700 (FIGS. 16, 17).

Figure 19:
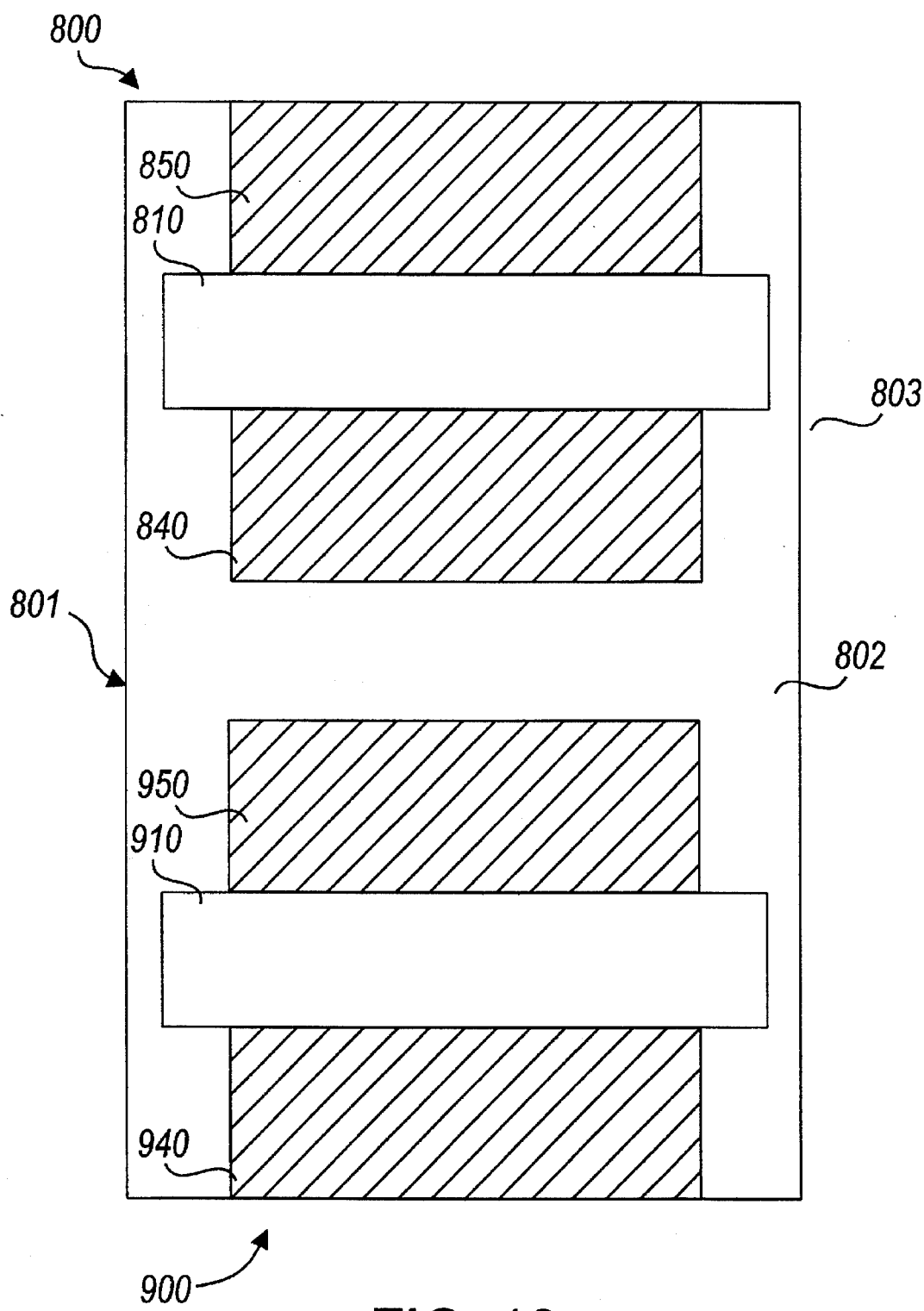
FIG. 19 is a top view of two transistors in accordance with one embodiment of the present invention.

FIG. 19 is a top view of two transistors in accordance with one embodiment of the present invention. Transistors 800 and 900 are fabricated within a region 801 formed on semiconductor substrate 802 by field oxide 803. Transistor 800 includes gate electrode 810, source 840 and drain 850. Transistor 900 includes gate electrode 910, source 940 and drain 950. Transistors 800 and 900 are fabricated in a manner similar to transistor 200. In the embodiment illustrated, source 840 of transistor 800 is laterally separated from drain 950 of transistor 900. This can be accomplished by fabricating a mask between transistors 800 and 900 prior to implanting these regions. Even though no field oxide is present for laterally isolating transistors 800 and 900, the portion of substrate 802 located between these transistors effectively isolates these transistors from one another. Transistors 800 and 900 could, for example, be used in SRAM memory cells 1600 or 1700 (FIGS. 16, 17).

In an alternate embodiment, source 840 contacts drain 950, thereby forming an electrical connection between source 840 and drain 950.

In yet other embodiments, transistors 800 and 900 can be fabricated as previously described in connection with transistors 205, 300, 305, 400 or 500.

Figure 20:
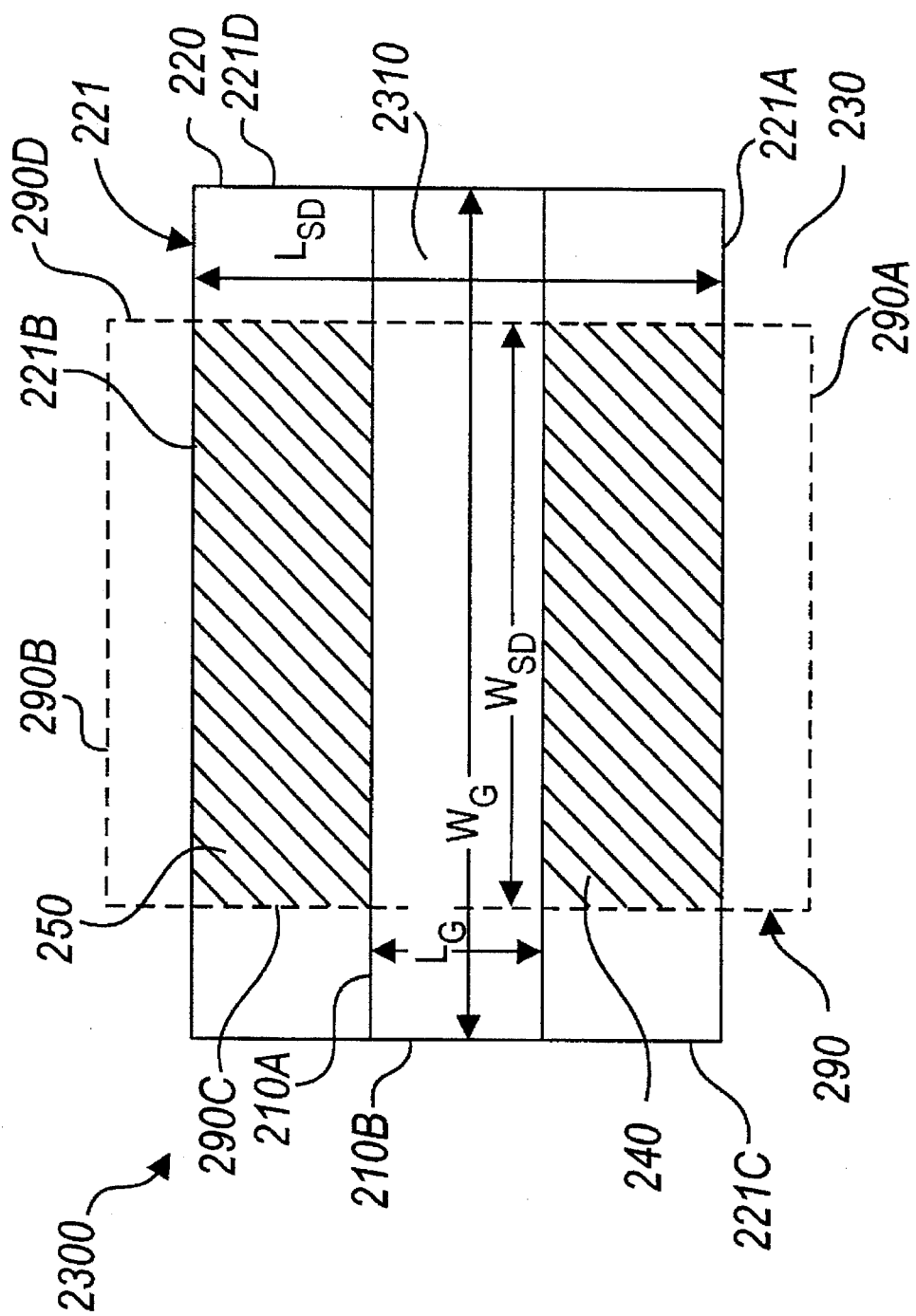
FIGS. 20–23 are top views of high capacitance transistors in accordance with alternate embodiments of the invention.

FIG. 20 is a top view of a high capacitance transistor 2300 in accordance with an alternate embodiment of the invention. Transistor 2300 is fabricated in a manner similar to transistor 200 (FIG. 4). Therefore, similar numbers are used to refer to similar elements. In transistor 2300, gate electrode 2310 extends to the edge of active region 220 such that gate electrode 2310 is laterally abutting the edge of active region 220. In one embodiment, gate electrode 2310 is positioned within 0.1 microns of active region 220. The edges of source and drain regions 240 and 250 (defined by edges 290c and 290d of mask 290) are laterally separated from the edges 221c and 221d of active region 220. In one embodiment, this lateral separation is approximately 0.5 to 1 microns.

Figure 21:
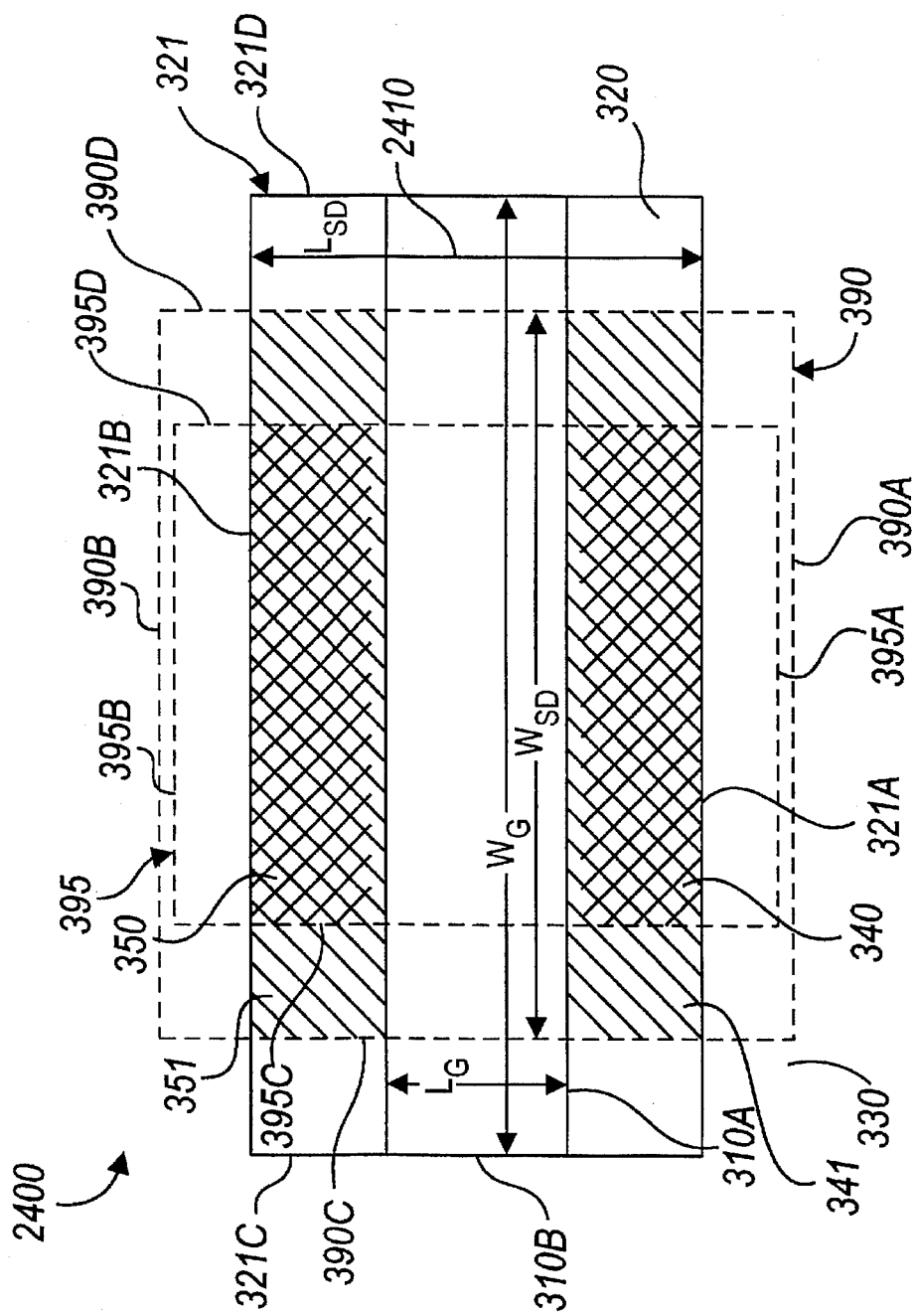

FIG. 21 is a top view of another embodiment of a high capacitance transistor 2400 in accordance with the invention. Transistor 2400 is fabricated in a manner similar to transistor 300 (FIG. 9). Therefore, similar numbers are used to refer to similar elements. In transistor 2400, gate electrode 2410 extends to the edge of active region 320. In one embodiment, gate electrode 2410 is positioned within 0.1 microns of active region 320. The edges of source and drain regions 340 and 350 (defined by edges 390c and 390d of mask 390 or edges 395c and 395d of mask 395) are laterally separated from the edges 321c and 321d of active region 320. In one embodiment, this lateral separation is approximately 0.5 to 1 microns.

Figure 22:
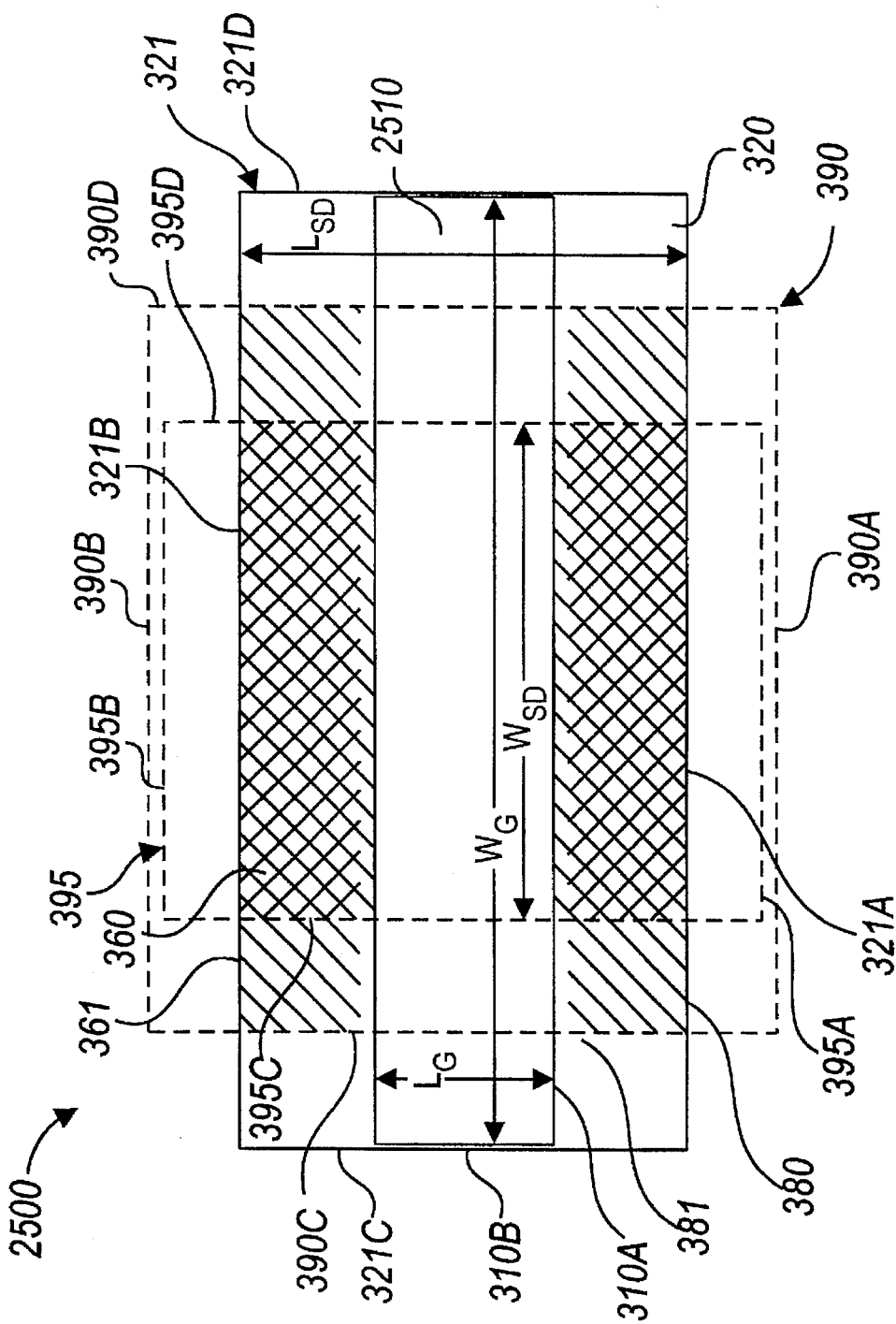

FIG. 22 is a top view of another embodiment of a high capacitance transistor 2500 in accordance with the invention. Transistor 2500 is fabricated in a manner similar to transistor 305 (FIG. 11). Therefore, similar numbers are used to refer to similar elements. In transistor 2500, gate electrode 2510 extends to the edge of active region 320. In one embodiment, gate electrode 2510 is positioned within 0.1 microns of active region 320. The edges of source and drain regions 360 and 380 (defined by edges 390c and 390d of mask 390 or edges 395c and 395d of mask 395) are laterally separated from the edges 321c and 321d of active region 320. In one embodiment, this lateral separation is approximately 0.5 to 1 microns.

Figure 23:
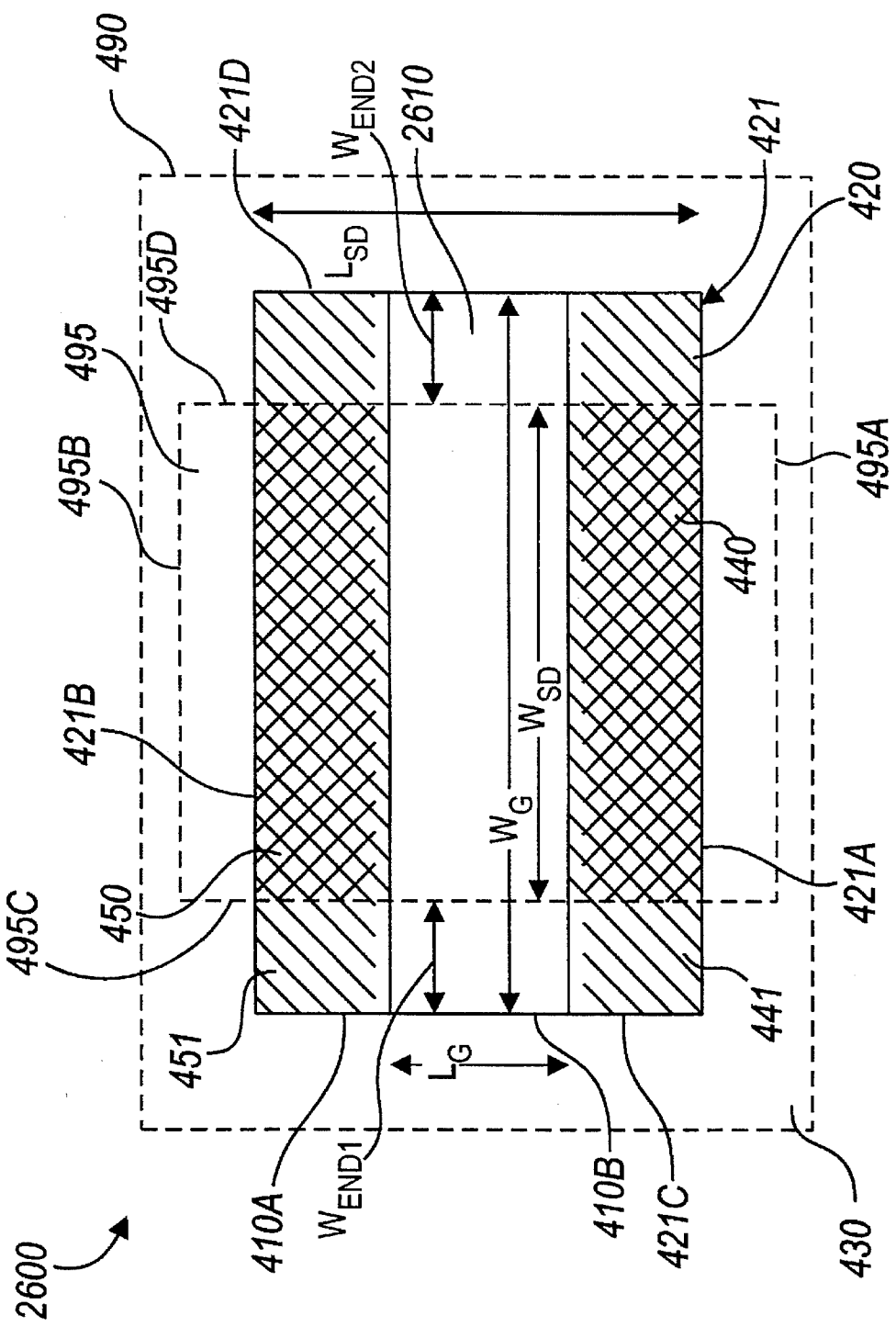

FIG. 23 is a top view of yet another embodiment of a high capacitance transistor 2600 in accordance with the invention. Transistor 2600 is fabricated in a manner similar to transistor 400 (FIG. 12). Therefore, similar numbers are used to refer to similar elements. In transistor 2600, gate electrode 2610 extends to the edge of active region 420. In one embodiment, gate electrode 2610 is positioned within 0.1 microns of active region 420. The edges of source and drain regions 440 and 450 (defined by edges 495c and 495d of mask 495) are laterally separated from the edges 421c and 421d of active region 420. In one embodiment, this lateral separation is approximately 0.5 to 1 microns.

The present invention is not limited to the embodiments described above. The high capacitance MOS transistor structures and other features of the invention can be used in many NMOS, PMOS, CMOS and BiCMOS circuits and in other technologies. While this invention has been described using n-channel field effect transistors, the principles of this invention apply equally to any use of a high capacitance semiconductor structure. In particular, the polarities of the semiconductor materials and dopants can be reversed such that n-type becomes p-type and vice versa. Furthermore, the above described transistors which include a field oxide layer typically include heavily doped p-type anti-inversion regions (not shown) beneath the field oxide layer. Also, the gate oxide layer of the above described transistors may exist over the entire active region at the upper surface of the substrate.

Additionally, the present invention is not limited to embodiments which utilize rectangular gate electrodes and active regions. The gate electrodes and active regions can have a variety of shapes. Also, the described transistors can have other dimensions, consistent with the desired transistor characteristics.

I claim:

1. A field effect transistor comprising:

a semiconductor substrate having an upper surface;

a field insulating layer situated along the upper surface of said semiconductor substrate and having a boundary which defines an active region of said substrate;

a gate dielectric layer located over said active region;

a gate electrode located over said gate dielectric layer and laterally separated from said boundary of said field insulating layer;

a source region situated in said active region adjacent to said dielectric layer, said source region having an edge which extends to said boundary of said field insulating layer; and a drain region situated in said active region, adjacent to said dielectric layer, said drain region having an edge which extends to said boundary of said field insulating layer, said drain and source regions being laterally separated within said active region, wherein said gate electrode is wider than said source and drain regions.

2. The transistor of claim 1, wherein said drain region is a lightly doped region and said transistor further comprises a more heavily doped drain region situated in said substrate adjacent to said gate electrode, said more heavily doped drain region being continuous with said drain region.

3. The transistor of claim 2, wherein said gate electrode is wider than said drain region and said more heavily doped drain region.

4. The transistor of claim 3, wherein said drain region is substantially the same width as said more heavily doped drain region.

5. A field effect transistor comprising:

a semiconductor substrate having an upper surface;

a field insulating layer situated along the upper surface of said semiconductor substrate and having a boundary which defines an active region of said substrate;

a gate dielectric layer located over said active region;

a gate electrode located over said gate dielectric layer and laterally separated from said boundary of said field insulating layer;

a source region situated in said active region adjacent to said dielectric layer; and a drain region situated in said active region adjacent to said dielectric layer, said drain and source regions being laterally separated within said active region, said drain region comprising a lightly doped drain region and a more heavily doped drain region situated in said substrate adjacent to said gate electrode, said more heavily doped drain region being continuous with said lightly doped drain region, said gate electrode being wider than said lightly doped drain region and said more heavily doped drain region, wherein said lightly doped drain region is wider than said more heavily doped drain region.

6. A field effect transistor comprising:

a semiconductor substrate having an upper surface;

a field insulating layer situated along the upper surface of said semiconductor substrate and having a boundary which defines an active region of said substrate;

a gate dielectric layer located over said active region;

a gate electrode located over said gate dielectric layer and laterally separated from said boundary of said field insulating layer;

a source region situated in said active region adjacent to said dielectric layer; and a drain region situated in said active region adjacent to said dielectric layer, said drain and source regions being laterally separated within said active region, said drain region comprising a lightly doped drain region and a more heavily doped drain region situated in said substrate adjacent to said gate electrode, said more heavily doped drain region being continuous with said lightly doped drain region, said gate electrode being wider than said lightly doped drain region and said more heavily doped drain region, wherein said more heavily doped drain region is wider than said lightly doped drain region.

7. The transistor of claim 1, wherein said transistor comprises one of a pair of cross-coupled storage transistors in an SRAM memory cell.

8. A field effect transistor comprising:

a semiconductor substrate having an upper surface;

a field insulating layer situated along the upper surface of said semiconductor substrate and having a boundary which defines an active region of said substrate, said active region having a first side and a second side;

a gate dielectric layer located over said active region;

a gate electrode located over said gate dielectric layer and overlapping said field insulating layer at said first side of said active region;

a source region situated in said active region and laterally separated from said first side of said active region; and a drain region situated in said active region and laterally separated from said first side of said active region.

9. The transistor of claim 8, wherein said gate electrode overlaps said field insulating layer at said second side, and said source and drain regions are laterally separated from said second side of said active regions.

10. The field effect transistor of claim 8, wherein said drain region is a lightly doped region and said transistor further comprises a more heavily doped drain region situated in said substrate adjacent to said gate electrode, said more heavily doped drain region being continuous with said drain region.

11. The field effect transistor of claim 10, wherein said more heavily doped drain region is wider than said drain region.

12. The field effect transistor of claim 11, wherein said more heavily doped drain region extends to said first side of said active region.

13. The field effect transistor of claim 8, wherein said transistor comprises one of a pair of cross-coupled storage transistors in an SRAM memory cell.

14. A field effect transistor comprising:
 a semiconductor substrate having an upper surface;
 a field insulating layer situated along the upper surface of said semiconductor substrate and having a boundary which defines an active region of said substrate, said active region having a first side and a second side;
 a gate dielectric layer located over said active region;
 a gate electrode located over said gate dielectric layer and laterally abutting said field insulating layer at said first side of said active region;
 a source region situated in said active region and laterally separated from said first side of said active region; and
 a drain region situated in said active region and laterally separated from said first side of said active region.

15. The transistor of claim 14, wherein said gate electrode laterally abuts said field insulating layer at said second side of said active region, and said source and drain regions are laterally separated from said second side of said active region.

16. The transistor of claim 14, wherein said gate electrode is wider than said source and drain regions.

17. The transistor of claim 14, wherein said drain region is a lightly doped region and said transistor further comprises a more heavily doped drain region situated in said substrate adjacent to said gate electrode, said more heavily doped drain region being continuous with said drain region.

18. The transistor of claim 17, wherein said more heavily doped drain region extends to said first side of said active region.

19. The transistor of claim 17, wherein said gate electrode is wider than said drain region and said more heavily doped drain region.

20. The transistor of claim 19, wherein said drain region is substantially the same width as said more heavily doped drain region.

21. The transistor of claim 19, wherein said drain region is wider than said more heavily doped drain region.

22. The transistor of claim 19, wherein said more heavily doped drain region is wider than said drain region.

23. The transistor of claim 14, wherein said transistor comprises one of a pair of cross-coupled storage transistors in an SRAM memory cell.

24. A multiple transistor structure comprising:
 a field insulating layer formed along an upper surface of a semiconductor substrate, said field insulating layer defining a boundary of an active region;
 a gate dielectric layer formed along said active region;
 a plurality of gate electrodes formed over said gate dielectric layer, said gate electrodes laterally separated from said boundary of said active region; and
 a plurality of source and drain regions corresponding to said gate electrodes, wherein each of said source and drain regions have portions which are laterally separated from said boundary of said active region and wherein at least one of said source and drain regions has a portion which abuts said boundary of said active region.

25. The multiple transistor structure of claim 24, wherein a source region of one transistor is coupled to a drain region of another transistor.

26. A multiple transistor structure comprising:
 a field insulating layer formed along an upper surface of a semiconductor substrate, said field insulating layer defining a boundary of an active region;
 a gate dielectric layer formed along said active region;
 a plurality of gate electrodes formed over said gate dielectric layer, wherein at least one of said gate electrodes has an end which laterally abuts said boundary of said active region; and
 a plurality of source and drain regions corresponding to said gate electrodes, wherein at each of said source and drain regions have portions which are laterally separated from said boundary of said active region and wherein at least one of said source and drain regions has a portion which abuts said boundary of said active region.

27. The multiple transistor structure of claim 26, wherein a source region of one transistor is coupled to a drain region of another transistor.

28. The field effect transistor of claim 8, wherein the active region further comprises a third side and a fourth side, wherein the source region adjoins the third side and the drain region adjoins the fourth side.

29. The field effect transistor of claim 14, wherein the active region further comprises a third side and a fourth side, wherein the source region adjoins the third side and the: drain region adjoins the fourth side.

* * * * *